US006725682B2

(12) United States Patent
Scott

(10) Patent No.: US 6,725,682 B2
(45) Date of Patent: Apr. 27, 2004

(54) COMPUTER COOLING APPARATUS

(75) Inventor: Alexander Robin Walter Scott, Calgary (CA)

(73) Assignee: Coolit Systems Inc., Calgary (CA)

( * ) Notice: Subject to any disclaimer, the term of this patent is extended or adjusted under 35 U.S.C. 154(b) by 81 days.

(21) Appl. No.: 10/025,846

(22) Filed: Dec. 26, 2001

(65) Prior Publication Data

US 2003/0010050 A1 Jan. 16, 2003

(30) Foreign Application Priority Data

Jul. 31, 2001 (CA) .............................. 2352997

(51) Int. Cl.[7] .............................. F25D 23/12
(52) U.S. Cl. .................. 62/259.2; 62/3.7; 165/80.3
(58) Field of Search .................. 62/3.3, 3.7, 259.7; 165/80.3, 80.4, 104.32; 361/699, 697

(56) References Cited

U.S. PATENT DOCUMENTS

| 3,481,393 | A | | 12/1969 | Chu |
| 3,524,497 | A | | 8/1970 | Chu et al. |
| 4,037,270 | A | | 7/1977 | Ahmann et al. |
| 4,093,971 | A | | 6/1978 | Chu et al. |
| 4,253,515 | A | | 3/1981 | Swiatosz |
| 4,512,161 | A | | 4/1985 | Logan et al. |
| 4,639,829 | A | | 1/1987 | Ostergren et al. |
| 4,712,158 | A | * | 12/1987 | Kikuchi et al. ............. 361/699 |
| 4,729,424 | A | | 3/1988 | Mizuno et al. |
| 4,791,983 | A | | 12/1988 | Nicol et al. |
| 5,028,988 | A | | 7/1991 | Porter et al. |
| 5,123,478 | A | | 6/1992 | Hosaka |
| 5,126,919 | A | * | 6/1992 | Yamamoto et al. ......... 361/700 |
| 5,144,531 | A | | 9/1992 | Go et al. |
| 5,216,580 | A | | 6/1993 | Davidson et al. |
| 5,251,095 | A | | 10/1993 | Miller et al. |
| 5,263,251 | A | | 11/1993 | Matthews |
| 5,285,347 | A | | 2/1994 | Fox et al. |
| 5,323,847 | A | | 6/1994 | Koizumi et al. |
| 5,394,936 | A | | 3/1995 | Budelman |

(List continued on next page.)

FOREIGN PATENT DOCUMENTS

| GB | 2 349 985 | 11/2000 |
| WO | WO 00/75763 | 12/2000 |
| WO | WO 03/007372 A2 * | 1/2003 |

OTHER PUBLICATIONS

Tom's Hardware Guide:CPU Guide—A Home Grown Water Cooler for 115 Dollars http://www.tomshardware.com/cpu/olq2/010528/index.html.

(List continued on next page.)

Primary Examiner—Melvin Jones
(74) Attorney, Agent, or Firm—Bennett Jones LLP

(57) ABSTRACT

An apparatus for cooling an electronic device that includes a fluid heat exchanger, a chiller, and a pump. The fluid heat exchanger transfers heat from a hot portion of the surface of the electronic device to a fluid and has a body through which the fluid may be circulated. The body has a protrusion having a first surface that may be thermally coupled to the hot portion such that the surface of the body is sufficiently distant from the surface of the electronic device that sufficient ambient air may circulate therebetween so as to substantially prevent condensation from forming on the surface of the electronic device and from forming on and dripping from the heat exchanger when the fluid is cooled to at least the dew point of the ambient air and circulated through the body. A heat-conducting path is provided from the first surface to a region of the body that is thermally coupled to the fluid when the fluid is circulated through the body. The chiller circulates the fluid through a chiller and the fluid heat exchanger.

61 Claims, 20 Drawing Sheets

U.S. PATENT DOCUMENTS

| | | | |
|---|---|---|---|
| 5,482,113 | A | 1/1996 | Agonafer et al. |
| 5,596,228 | A | 1/1997 | Anderton et al. |
| 5,606,341 | A | 2/1997 | Aguilera |
| 5,646,824 | A | 7/1997 | Ohashi et al. |
| 5,699,227 | A | 12/1997 | Kolman et al. |
| 5,731,954 | A | 3/1998 | Cheon |
| 5,757,615 | A | 5/1998 | Donahoe et al. |
| 5,829,516 | A | 11/1998 | Lovachkin |
| 5,859,763 | A | 1/1999 | Nam et al. |
| 5,909,056 | A | 6/1999 | Mertol |
| 5,918,469 | A | 7/1999 | Cardella |
| 5,959,837 | A | 9/1999 | Yu |
| 6,029,742 | A | 2/2000 | Burward-Hoy |
| 6,125,036 | A | 9/2000 | Kang et al. |
| 6,154,363 | A | 11/2000 | Chang |
| 6,161,612 | A | 12/2000 | Ståhl et al. |
| 6,166,907 | A | 12/2000 | Chien |
| 6,182,742 | B1 | 2/2001 | Takahashi et al. |
| 6,184,580 | B1 | 2/2001 | Lin |
| 6,196,003 | B1 | 3/2001 | Macias et al. |
| 6,226,178 | B1 | 5/2001 | Broder et al. |

OTHER PUBLICATIONS

Modine Electronics Cooling http://www.modine.com/markets/m_ecoolinghtml.html.

http://www.swiftnets.com/store/watercooling.htm.

How to Build your Own Cross Drilled Copper Waterblock http://www.overclockers.com/tips206/.

MCW2000 assembly instructions—Active Liquid Cooler http://www.swiftnets.com/MCW2000Manual.htm.

Blizzrd Water Cooler Installation Instructions http://www.overclockershideout.com/instru.html.

ACDC Cool–Whip™ Liquid Kolesystem http://www.acdc.dk/products/coolwhip/coolwliq/clwliquk.htm.

MCW 370 Major Product Upgrade:MCW371™Active Liquid Cooler http://www.swiftnets.com/MCW370.htm.

Tweaktown—Waterblock Roundup http://www.tweaktown.com/reviews/waterblockroundup.

Melcor—Liquid Heat Exchangers http://www.melcor.com/liquid.htm.

R–Theta http://www.r–theta.com/products/aquasink/aquasink.pdf.

Thermacare International—Heat Pipe Technology http://www.thermacore.com/hpt_faqs.htm.

Thermacore International Inc., Global Leader in Thermal Management http://www.thermacore.com/thermabase.htm.

Intel—Pentium® III Processor for the SC 242 at 450 $MH_z$ to 1.13 GHz.

MCW 462 Water Block http://www.swiftnets.com/mcw462.htm.

Socket sealing—Eliminating Condensation in Socket Mother Boards and Adapters http://www.swiftnets.com/socketsealing.htm.

Swiftech MCW 462 Waterblock http://www.overclockers.com/articles 300/.

MCW 300—Major Product Upgrades:MCW311 Active Liquid Cooler http://www.swiftnets.com/mcw370.htm.

Overclocker Hideout TM http://www.overclockershideout.com/instructionsslotl.html.

Water Cooling wysiwyg://4/http://www.overclockers.com/topiclist/index31.asp.

* cited by examiner

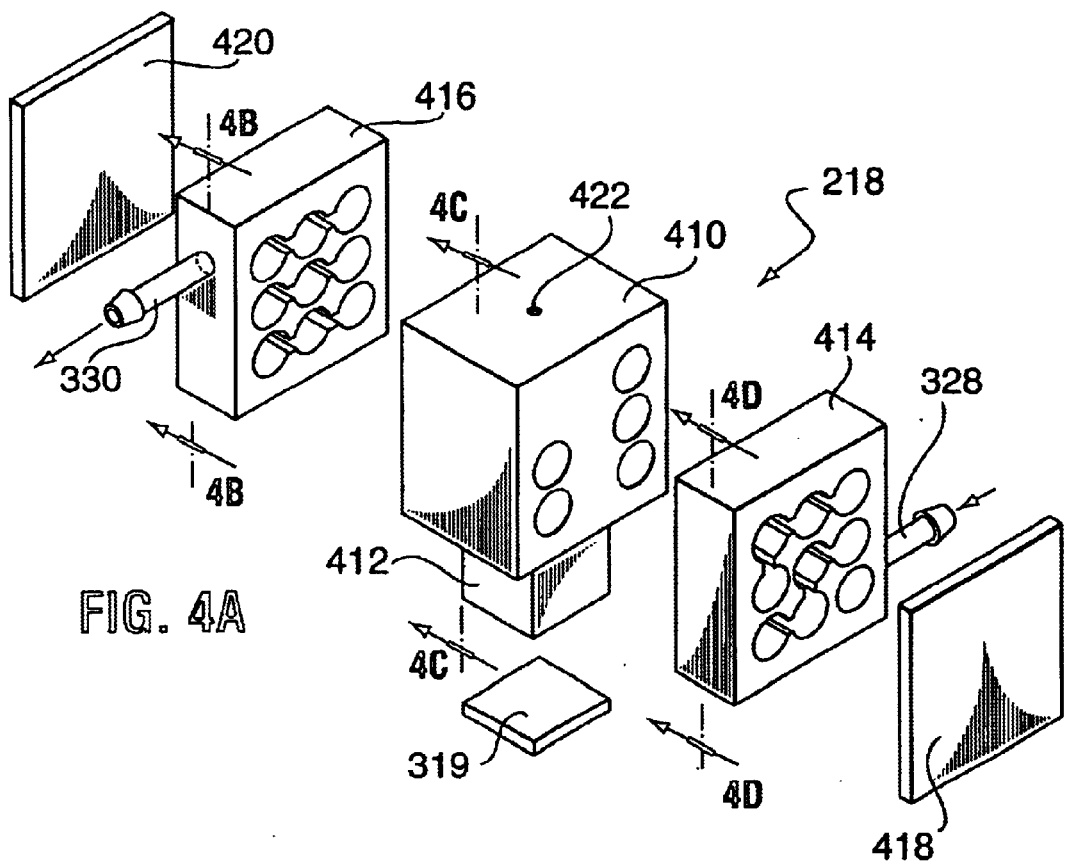
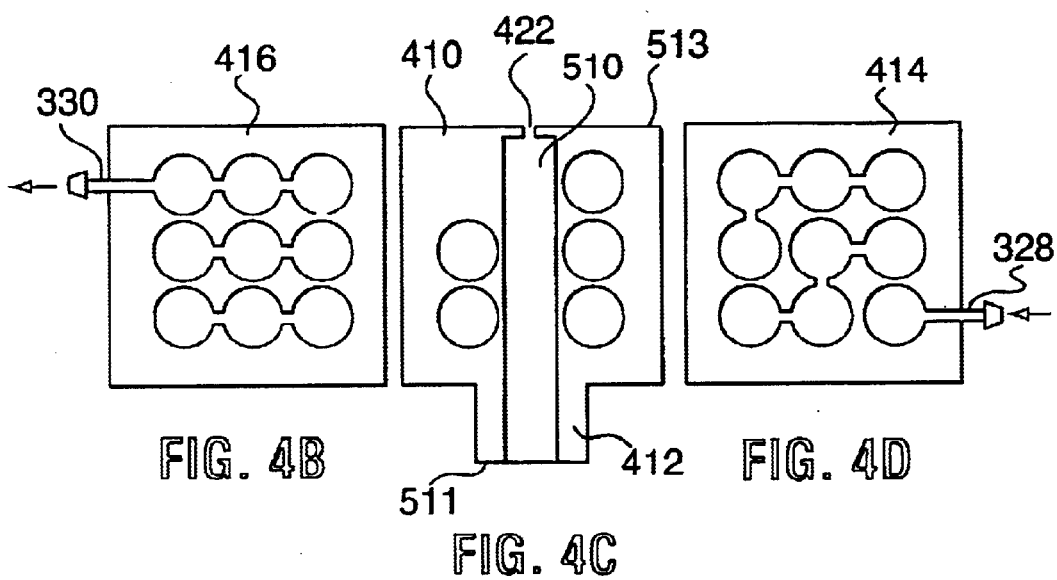

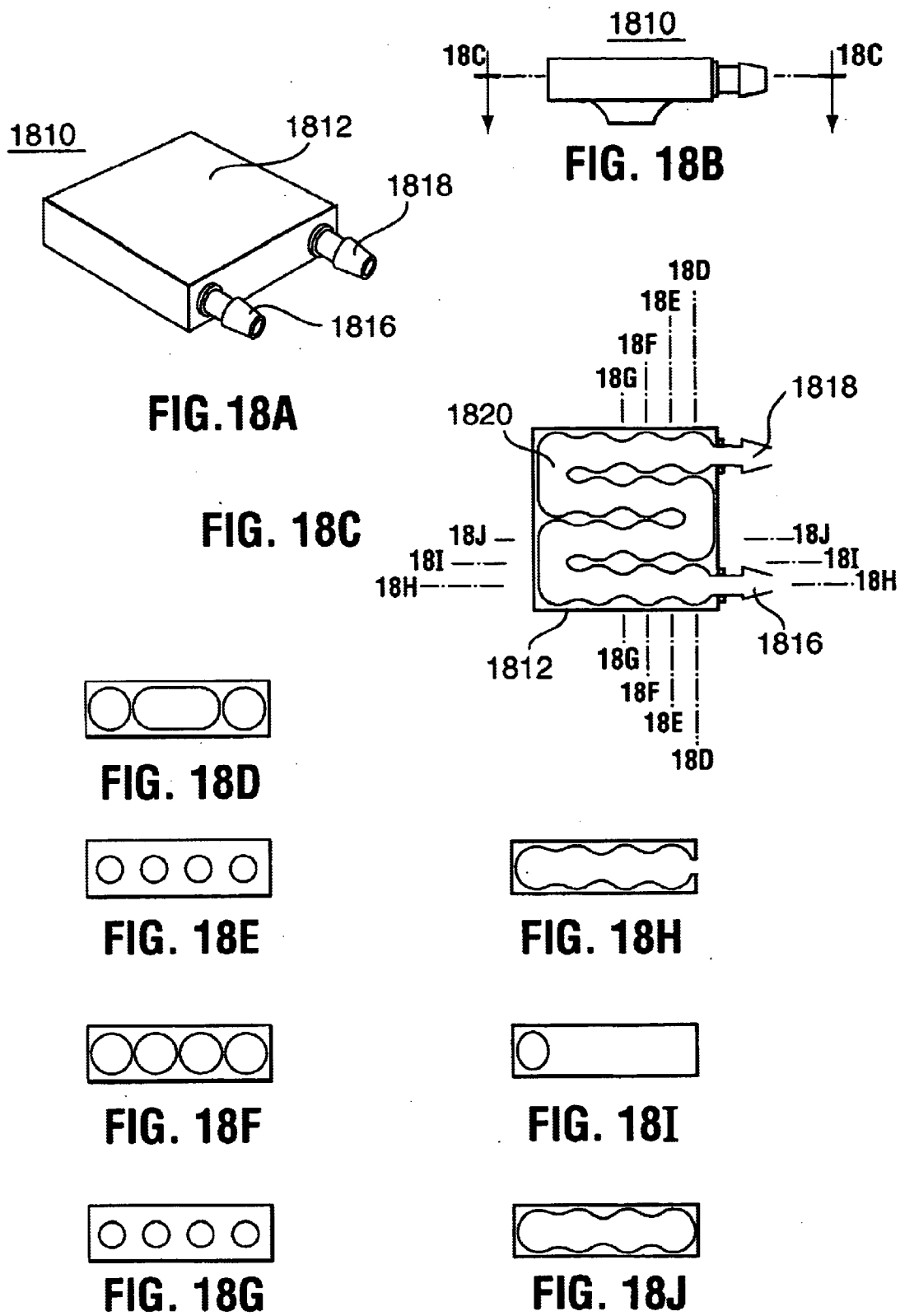

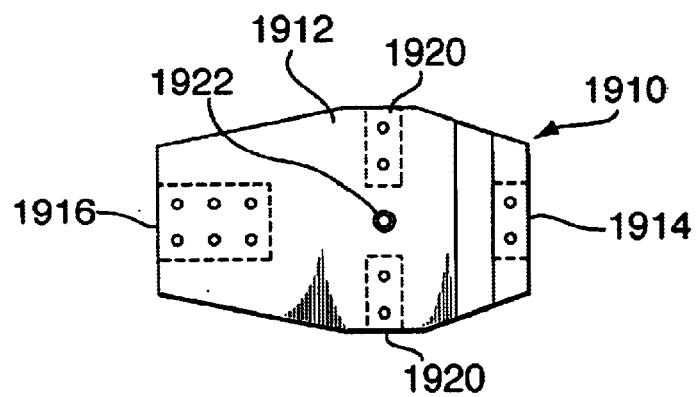
FIG. 19A
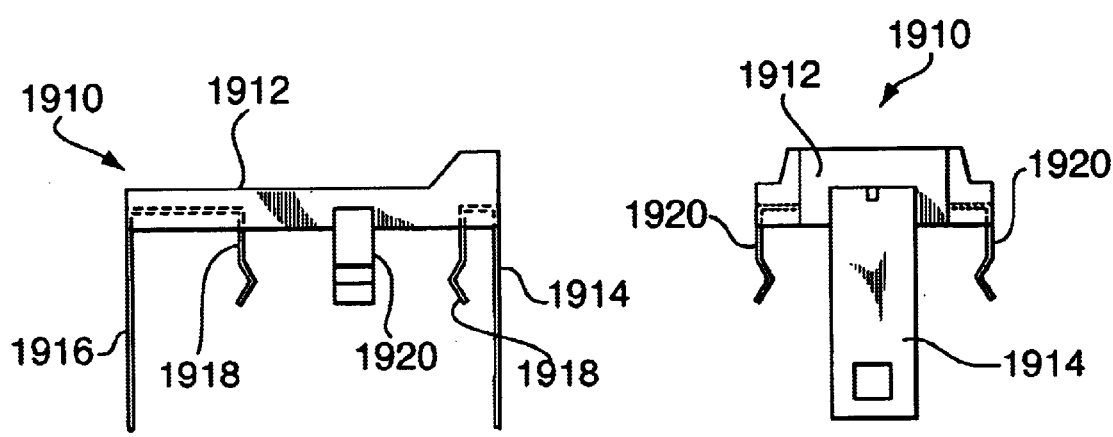
FIG. 19B  FIG. 19C

COMPUTER COOLING APPARATUS

CROSS-REFERENCE TO RELATED APPLICATION

This application is related to a commonly-owned application, filed on or about Dec. 17, 2001, entitled "Inverter", having application number (to be assigned), which is incorporated herein by reference.

BACKGROUND

The invention relates to the field of cooling electronic devices and, in particular, to using circulating fluids to cool microprocessors, graphics processors, and other computer components.

Microprocessor dies typically used in personal computers are packaged in ceramic packages that have a lower surface provided with a large number of electrical contacts (e.g., pins) for connection to a socket mounted to a circuit board of a personal computer and an upper surface for thermal coupling to a heat sink. In the following description, a die and its package are referred to collectively as a microprocessor.

Elevation views of typical designs for heat sinks suggested by Intel Corporation for its Pentium® III microprocessor are shown in FIGS. 1A and 1B.

In FIG. 1A, a passive heat sink indicated generally by reference numeral 110 is shown. The passive heat sink 110 comprises a thermal plate 112 from the upper surface of which a number of fins, one of which is indicated by reference numeral 114, protrude perpendicularly. The passive heat sink 110 is shown in FIG. 1A installed upon a microprocessor generally indicated by reference numeral 118. The microprocessor 118 is comprised of a die 116 and a package 120. The die 116 protrudes from the upper surface of the package 120. The lower surface of the package 120 is plugged into a socket 122, which is in turn mounted on a circuit board (not shown). The passive heat sink 110 is installed by bringing the lower surface of the thermal plate 112 into contact with the exposed surface of the die 116. When installed and operated as recommended by the manufacturer, ambient airflow passes between the fins in the direction shown by an arrow 124 in FIG. 1A.

In FIG. 1B, an active heat sink, indicated generally by reference numeral 126, is shown. The active heat sink 126 comprises a thermal plate 128 from the upper surface of which a number of fins 130 protrude perpendicularly. A fan 132 is mounted above the fins 130. The active heat sink 126 is shown in FIG. 1B installed upon a microprocessor, generally indicated by reference numeral 136, which is comprised of a die 134 and a package 138. The die 134 protrudes from the upper surface of the package 138. The lower surface of the package 138 is plugged into a socket 140, which is in turn mounted on a circuit board (not shown). The active heat sink 126 is installed by bringing the lower surface of the thermal plate 128 into contact with the exposed surface of the die 134. When installed and operated as recommended by the manufacturer, ambient air is forced between the fins 130 in the direction shown by an arrow 142 in FIG. 1B.

A difficulty with the cooling provided by the heat sinks shown in FIGS. 1A and 1B is that at best the temperature of the thermal plates 112, 128 can only approach the ambient air temperature. If the microprocessor 118, 136 is operated at a high enough frequency, the die 116, 134 can become so hot that it is difficult to maintain a safe operating temperature at the die 116, 134 using air cooling in the manner shown in FIGS. 1A and 1B.

Liquid cooling, which is inherently more efficient due to the greater heat capacity of liquids, has been proposed for situations in which air cooling in the manner illustrated in FIGS. 1A and 1B is inadequate. In a typical liquid cooling system, such as that illustrated in FIG. 1C, a heat conductive block 144 having internal passages or a cavity (not shown) replaces the thermal plate 128 in FIG. 1B. The block 144 has an inlet and an outlet, one of which is visible and indicated by reference numeral 146 in FIG. 1C. Liquid is pumped into the block 144 through the inlet and passes out of the block 144 through the outlet to a radiator or chiller (not shown) located at some distance from the block 144. The block 144 is shown in FIG. 1C installed upon a microprocessor generally indicated by reference numeral 148, which is comprised of a die 150 and a package 152. The die 150 protrudes from the upper surface of the package 152. The lower surface of the package 152 is plugged into a socket 154, which is in turn mounted on a circuit board (not shown). The block 144 is installed by bringing its lower surface into contact with the exposed surface of the die 150.

In all liquid cooling systems known to the inventor, only a small portion of the lower surface of the block 144 comes into contact with the die 150. Since the die 150 protrudes above the upper surface of the package 152, a gap 156 remains between the upper surface of the package 152 and the block 144. If the gap 156 is not filled with insulation and sealed, convective and radiative heat transfer from the package 152 to the block 144 may occur. This will have no serious consequences so long as the block 144 is not cooled below the dew point of the air in the gap 156. If the liquid pumped through block 144 is only cooled by a radiator, then that liquid and consequently the block 144, can only approach the ambient air temperature. However, if a chiller is used to cool the liquid, then the temperature of the block 144 can decrease below the ambient air temperature, which may allow condensation to form on the package 152 or the block 144. Such condensation, if not removed, can cause electrical shorts, which may possibly destroy the microprocessor 148.

Current solutions to the condensation problem referred to above include (1) controlling the chiller so that the temperature of the block 144 does not decrease below the dew point of the air in the gap 156 or (2) providing sufficient insulation and sealing material to prevent condensation from forming or to at least prevent any condensation that does form from reaching critical portions of the microprocessor 148 or surrounding circuit elements. Placing a lower limit on the temperature of the chiller limits the amount of heat that can effectively be removed from the microprocessor 148 without using bulky components. Further, the operating temperature of the microprocessor 148 can only approach the temperature of the block 144; operation at lower temperatures may be desirable in many circumstances. Alternatively, if insulation and sealing is used, trained technicians must do the installation properly if the installation is to be effective. If the insulation or seals fail, condensation can occur and cause catastrophic failure of the personal computer. A simpler, more reliable solution to the condensation problem is needed.

SUMMARY

In one aspect the invention provides a heat exchanger for extracting heat from an electronic device, such as a microprocessor, through a hot portion of the surface of the electronic device. The heat exchanger has a body through which a fluid may be circulated. The body has a protrusion having a first surface that may be thermally coupled to the hot portion of the electronic device. A heat-conducting path is provided from the first surface to a region of the body that is thermally coupled to the fluid when the fluid is circulated through the body. Preferably, when the first surface is thermally coupled to the hot portion, the surface of the body is sufficiently distant from the surface of said electronic device other than the hot portion that sufficient ambient air may circulate therebetween so as to substantially prevent condensation from forming on the surface of said electronic device and from forming on and dripping from the heat exchanger when said fluid is cooled to at least the dew point of the ambient air and circulated through the body.

In another aspect the invention provides a heat exchanger for extracting heat from an electronic device through a hot portion of the surface of the electronic device. The heat exchanger includes a body that may be cooled by a circulating fluid and a conduit for circulating the cooling fluid. The body has a first surface that may be thermally coupled to the hot portion of the electronic device and a heat-conducting path from the first surface to a portion of the body that is thermally coupled to the fluid when the fluid is circulated. Preferably, when the first surface is thermally coupled to the hot portion, the surface of the body other than the first surface and the conduit are sufficiently distant from the surface of the electronic device other than the hot portion that sufficient ambient air may circulate therebetween so as to substantially prevent condensation from forming on the surface of the electronic device and from forming on and dripping from the heat exchanger when the fluid is cooled to at least the dew point of the ambient air and circulated.

In another aspect the invention provides an apparatus for extracting heat from an electronic device, such as a microprocessor. The apparatus includes a first fluid heat exchanger for transferring heat from a hot portion of the surface of the electronic device to a fluid, a chiller for chilling the fluid, and a pump for circulating said fluid through said chiller and said first fluid heat exchanger. The first fluid heat exchanger includes a body through which the fluid may be circulated. The body has a protrusion having a first surface that may be thermally coupled to the hot portion. Preferably, when the first surface is thermally coupled to the hot portion, the surface of the body is sufficiently distant from the surface of the electronic device other than the hot portion that sufficient ambient air may circulate therebetween so as to substantially prevent condensation from forming on the surface of said electronic device and from forming on and dripping from the heat exchanger when the fluid is cooled to at least the dew point of the ambient air and circulated through the body. A heat-conducting path is provided from the first surface to a region of the body that is thermally coupled to the fluid when the fluid is circulated through the body.

BRIEF DESCRIPTION OF THE DRAWINGS

FIG. 4A is a schematic exploded isometric view of the fluid heat exchanger shown in FIG. 3A.

FIGS. 4B, 4C, and 4D are schematic cross-sectional views of the fluid heat exchanger of FIG. 4A taken along lines 4B—4B, 4C—4C, and 4D—4D of FIG. 4A, respectively.

FIG. 18A is a schematic isometric view of a molded or cast fluid one-piece heat exchanger for use in the chiller modules of FIGS. 8, 10, and 14.

FIG. 18B is a schematic elevation view of the fluid heat exchanger of FIG. 18A.

FIG. 18C is a schematic cross-sectional view of the fluid heat exchanger of FIG. 18A taken along line 18C—18C of FIG. 18B.

FIGS. 18D, 18E, 18F, 18G, 18H, 18I, and 18J are schematic cross-sections of the fluid heat exchanger of FIG. 18A taken along lines 18D—18D, 18E—18E, 18F—18F, 18G—18G, 18H—18H, 18I—18I, and 18J—18J of FIG. 18C, respectively. The barbs are not shown.

FIG. 19A is a schematic plan view of a molded retainer for retaining a fluid heat exchanger coupled to a CPU microprocessor in accordance with the invention.

FIG. 19B is a schematic front elevation view of the retainer of FIG. 19A.

FIG. 19C is a schematic side elevation view of the retainer of FIG. 19A.

DETAILED DESCRIPTION

Figure 2A:
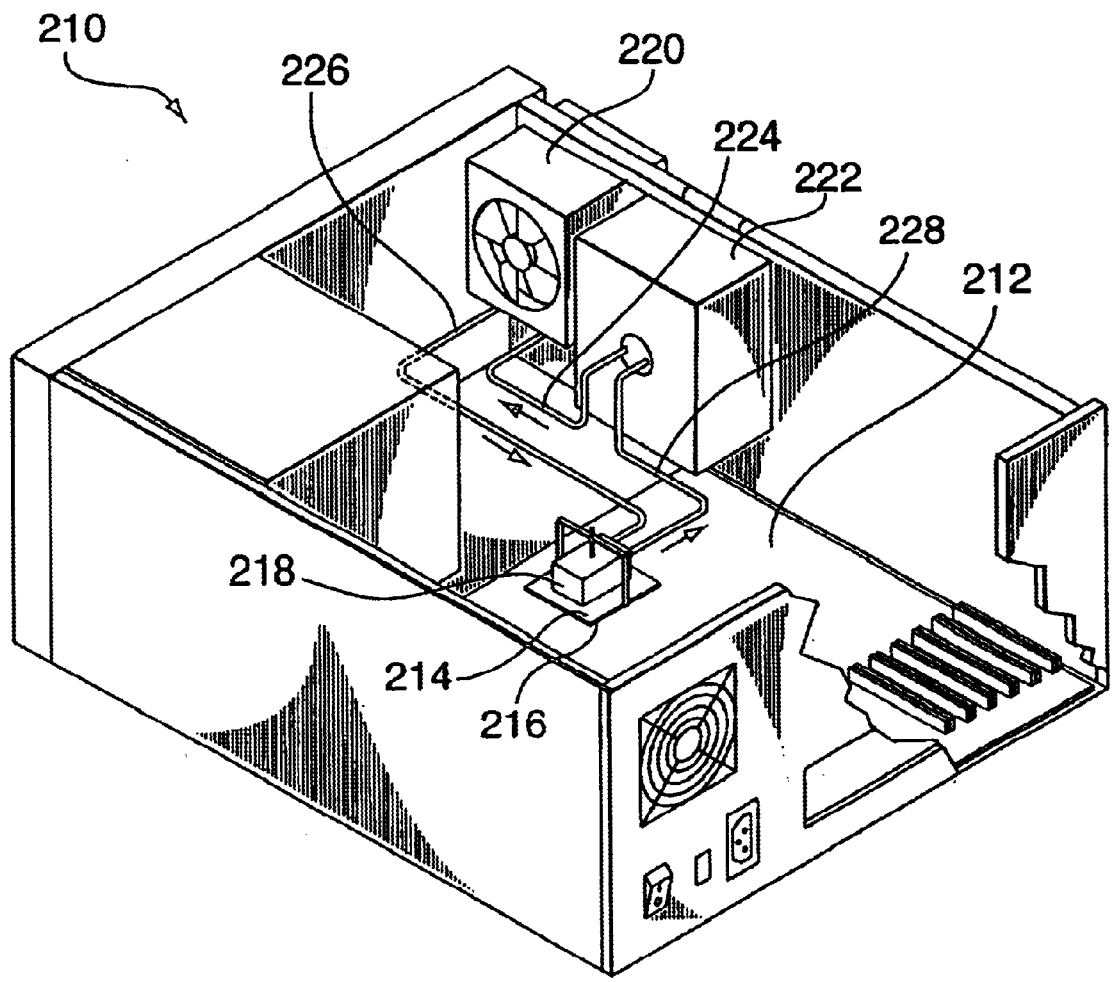
FIG. 2A is a schematic pictorial view of a partially assembled desktop personal computer with an embodiment of the cooling apparatus described herein installed. Many of the conventional components of the desktop personal computer that are not relevant to the cooling apparatus are omitted.
Figure 2B:
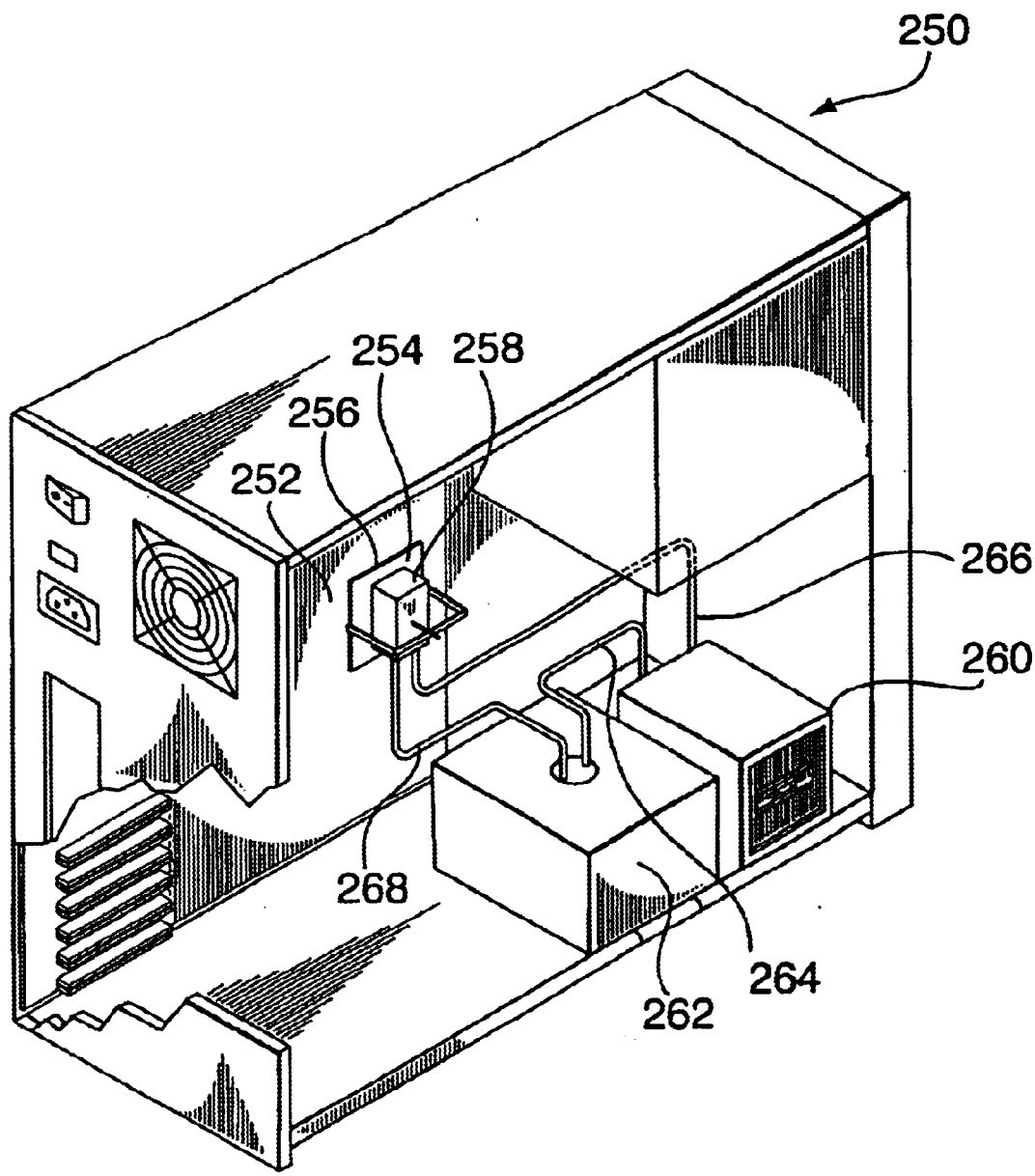
FIG. 2B is a schematic pictorial view of a partially assembled tower-case personal computer with an embodiment of the cooling apparatus described herein installed. Many of the conventional components of the desktop personal computer that are not relevant to the cooling apparatus are omitted.

Two embodiments of the present invention are shown in FIGS. 2A and 2B as they would appear when installed in two typical forms of desktop personal computer ("PC"), the PCs generally indicated by reference numerals 210 and 250, respectively. In FIG. 2A, the PC 210 is a desktop-type PC, while in FIG. 2B, the PC 250 is a tower-type PC. In FIGS. 2A and 2B, the PC 210, 250 is shown with its case cover and power supply removed so that a cooling apparatus that is an embodiment of the present invention can be seen. Each PC 210, 250 has a motherboard 212, 252 together with a CPU microprocessor 214, 254 mounted in a socket 216, 256 as shown schematically in FIGS. 2A and 2B. In each case, the socket 216, 256 is mounted on the motherboard 212, 252. Other conventional components are omitted.

Figure 1A:
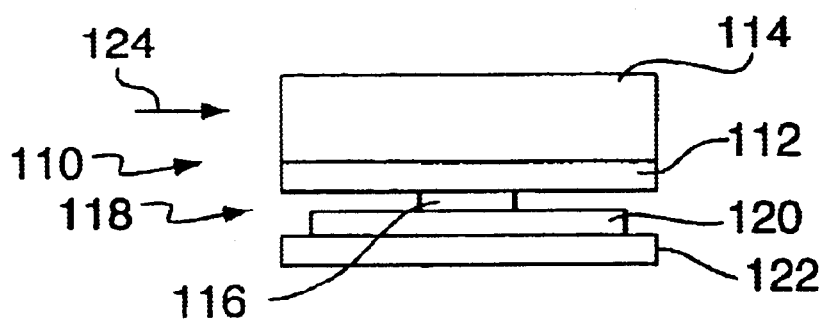
FIG. 1A is a schematic elevation view of a conventional passive heat sink installed on a microprocessor.
Figure 1B:
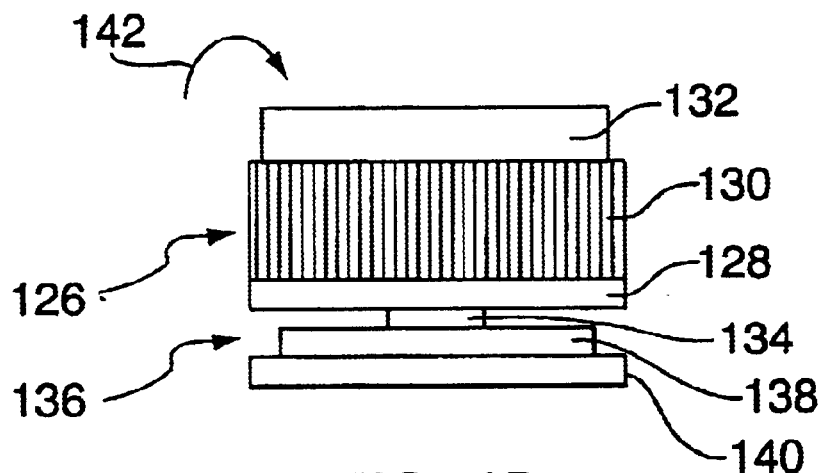
FIG. 1B is a schematic elevation view of a conventional active heat sink installed on a microprocessor.

As illustrated in FIGS. 2A and 2B, each cooling apparatus is comprised of three modules: a heat exchanger 218, 258 mounted in contact with the CPU microprocessor 214, 254; a chiller module 220, 260; and a pump module 222, 262. Each heat exchanger 218, 258 is mounted so as to be thermally coupled to a CPU microprocessor 214, 254 and replaces a conventional heat sink such as those shown in FIGS. 1A and 1B. The details of the manner in which the heat exchangers 218, 258 are mounted are described below. The chiller module 220, 260 and the pump module 222, 262 are mounted to the case of the PC 210, 250 and connected together by a first section of tubing 224, 264. The chiller module 220, 260 is connected to the heat exchanger 218, 258 by a second section of tubing 226, 266. The heat exchanger 218, 258 is connected to the pump module 222, 262 by a third section of tubing 228, 268. In operation, fluid is pumped from the pump module 222, 262 through the chiller module 220, 260, then through the heat exchanger 218, 258, and finally returns to the pump module 222, 262. When the cooling apparatus is operating, chilled fluid passes through the heat exchanger 218, 258 so as to extract heat produced by the microprocessor 214, 254.

Figure 3A:
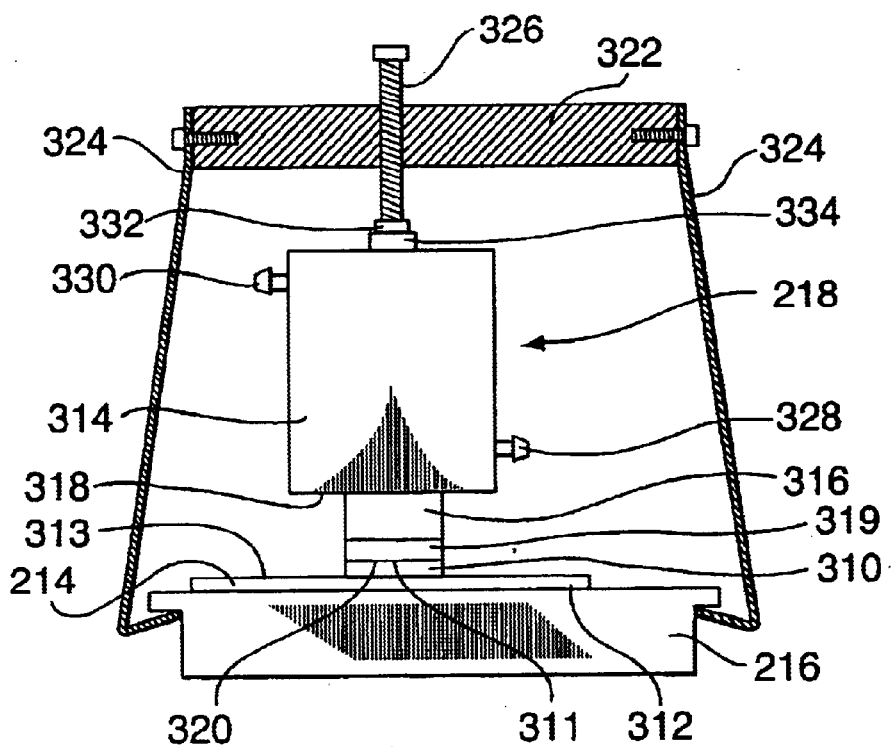
FIG. 3A is a schematic elevation view of a portion of the desktop personal computer of FIG. 2A showing a fluid heat exchanger in accordance with the present invention coupled to the CPU microprocessor of the computer.
Figure 3B:
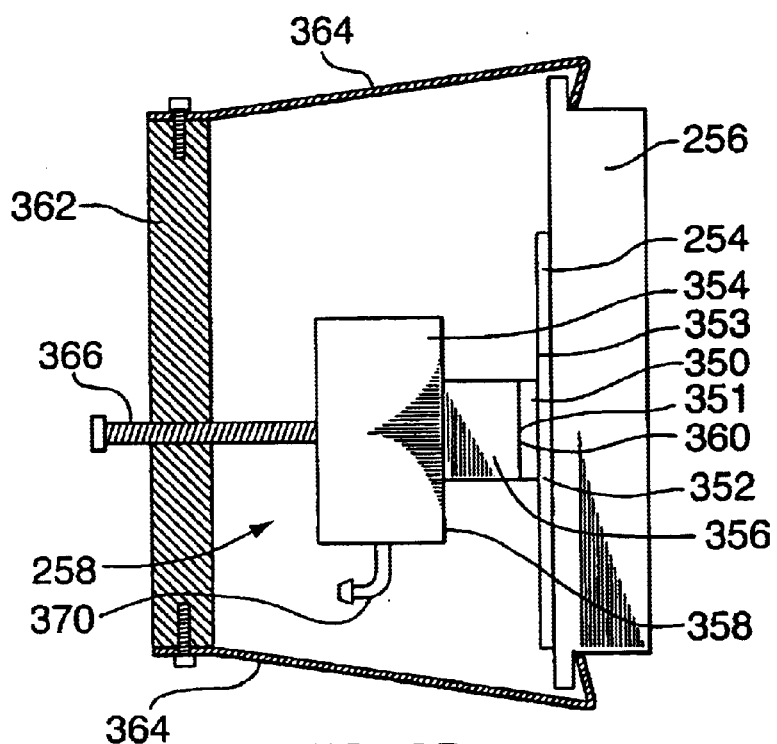
FIG. 3B is a schematic elevation view of a portion of the tower-case personal computer of FIG. 2B showing a fluid heat exchanger in accordance with the present invention coupled to the CPU microprocessor of the computer.

FIGS. 3A and 3B provide more detailed views of the heat exchangers 218, 258 as mounted on the microprocessors 214, 254 in FIGS. 2A and 2B. The upright heat exchanger 218 of FIG. 2A differs in several details from the horizontal heat exchanger 258 of FIG. 2B. Hence, each is described separately.

In FIG. 3A, the microprocessor 214 can be seen to be of the conventional flip-chip type comprising a die 310 mounted in a mounting package 312. The die 310 extends above the surrounding surface 313 of the mounting package 312 and provides a non-active surface 311 that is generally parallel to the surrounding surface 313. In this type of mounting, no thermal plate is provided as part of the microprocessor 214, it being intended that a heat sink will be installed directly in contact with the non-active surface 311. "Non-active surface" as used herein refers to the face of a die that does not have electrical contacts and that is normally exposed to cooling air flow or placed in contact with a heat sink or other means from removing heat from the die 310.

Figure 1C:
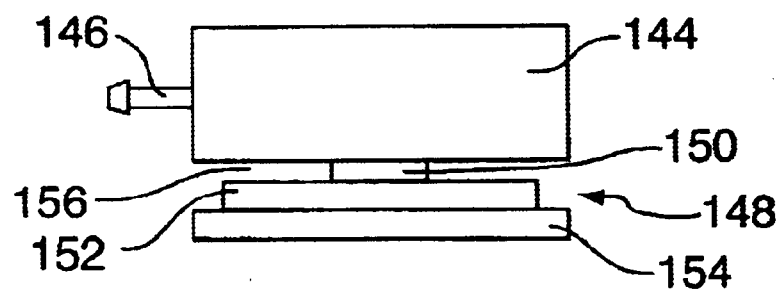
FIG. 1C is a schematic elevation view of a conventional liquid-cooled heat sink installed on a microprocessor.

As illustrated in FIG. 3A, the upright heat exchanger 218 is comprised of a cuboid body 314 of a heat-conducting material such as copper, aluminum, or plastic that has a cuboid protrusion 316 extending from its bottom face 318. Optionally, the bottom face of the protrusion 316 may be a thin silver cap 319. As will be discussed in relation to FIGS. 4A–4E, the body 314 contains internal passages and chambers (not shown in FIG. 3A) through which a fluid may be circulated. The protrusion 316 ends in a face 320 (sometimes referred to as a surface herein), which should preferably be dimensionally substantially congruent with the non-active surface 311 of the die 310. Some of the advantages of the invention are reduced if the face 320 is not substantially congruent with the non-active surface 311. If the face 320 does not contact the entire non-active surface 311, then the rate at which heat can be transferred is reduced, although if for some reason the die is not uniformly hot, this may be desirable or at least tolerable. On the other hand, if the face 320 is larger than the non-active surface 311, the disadvantages of conventional liquid heat exchangers such as that shown in FIG. 1C begin to appear as the difference in size increases. An empirical approach should be used to applying the present invention to a particular microprocessor installation.

Figure 3C:
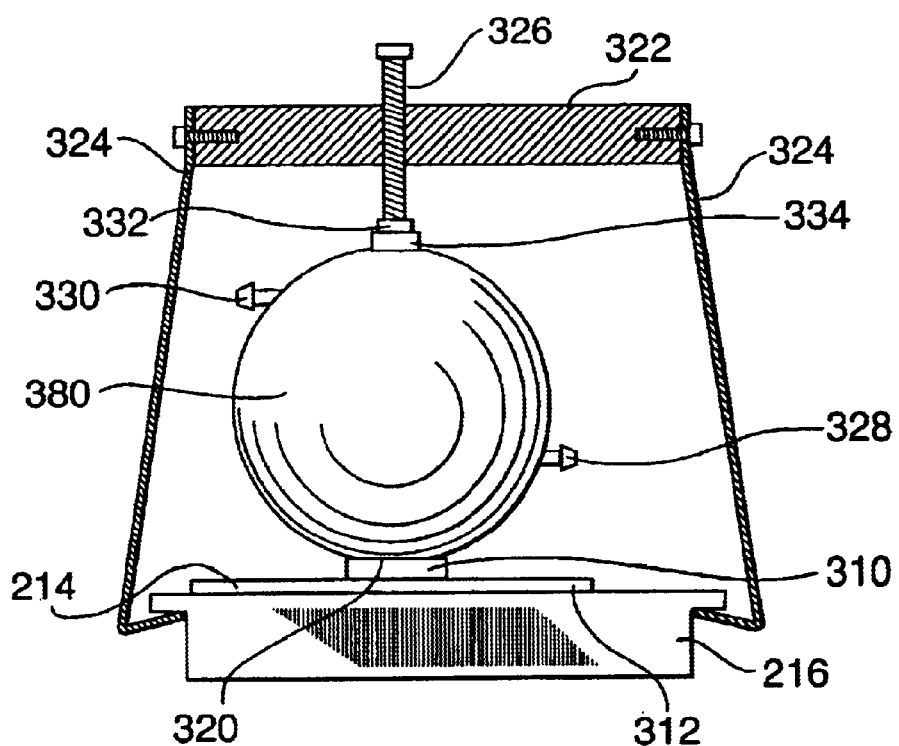
FIGS. 3C–3F are schematic elevation views of a series of variant fluid heat exchangers.
Figure 3D:
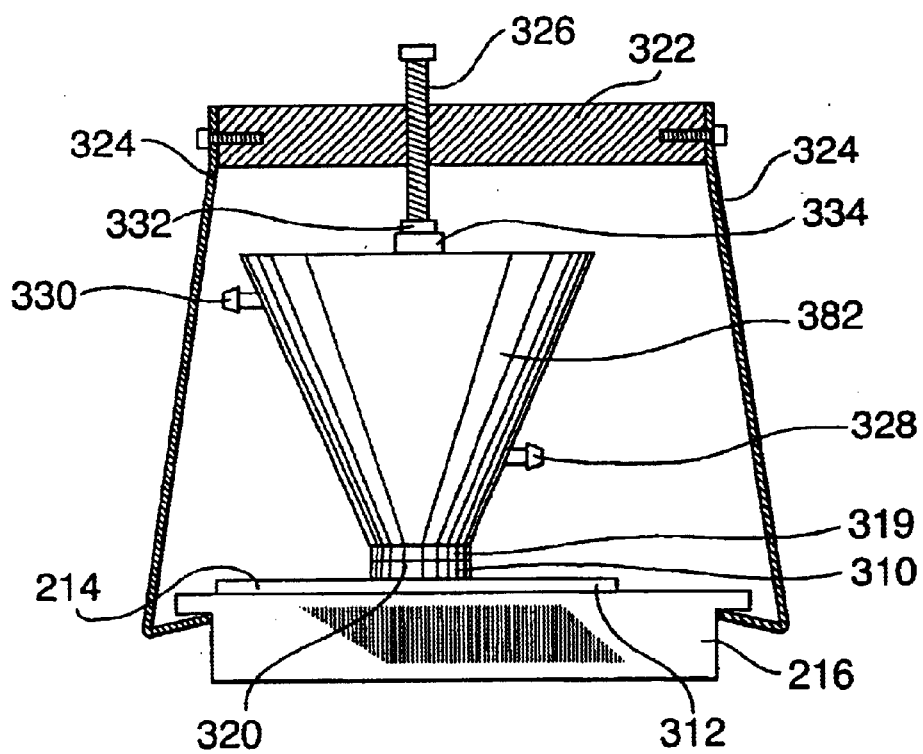
Figure 3E:
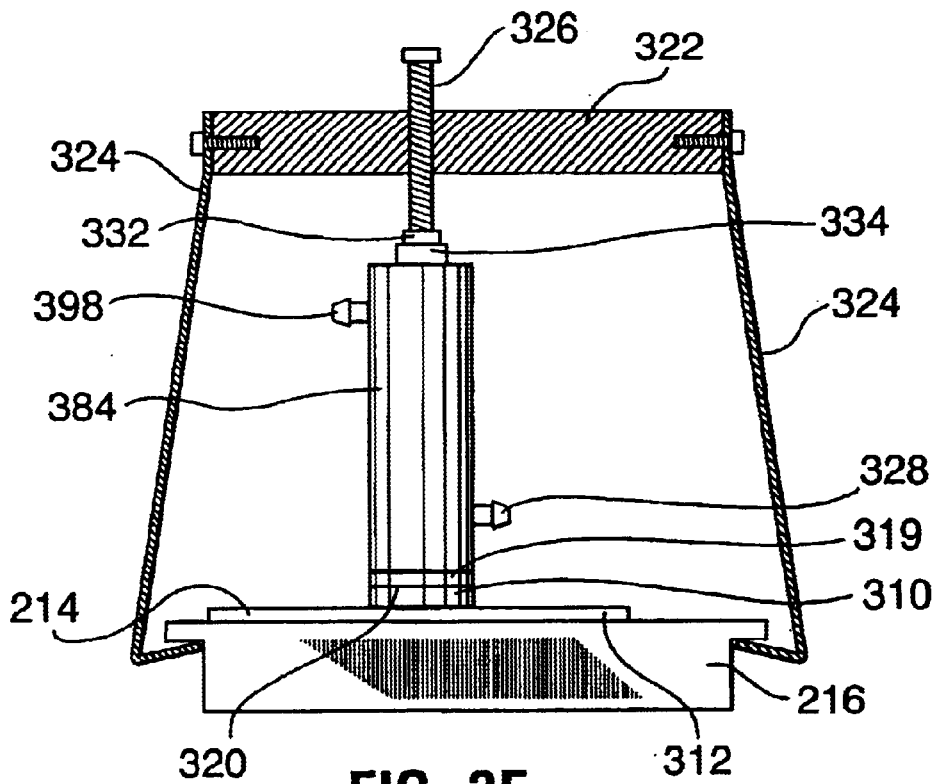
Figure 3F:
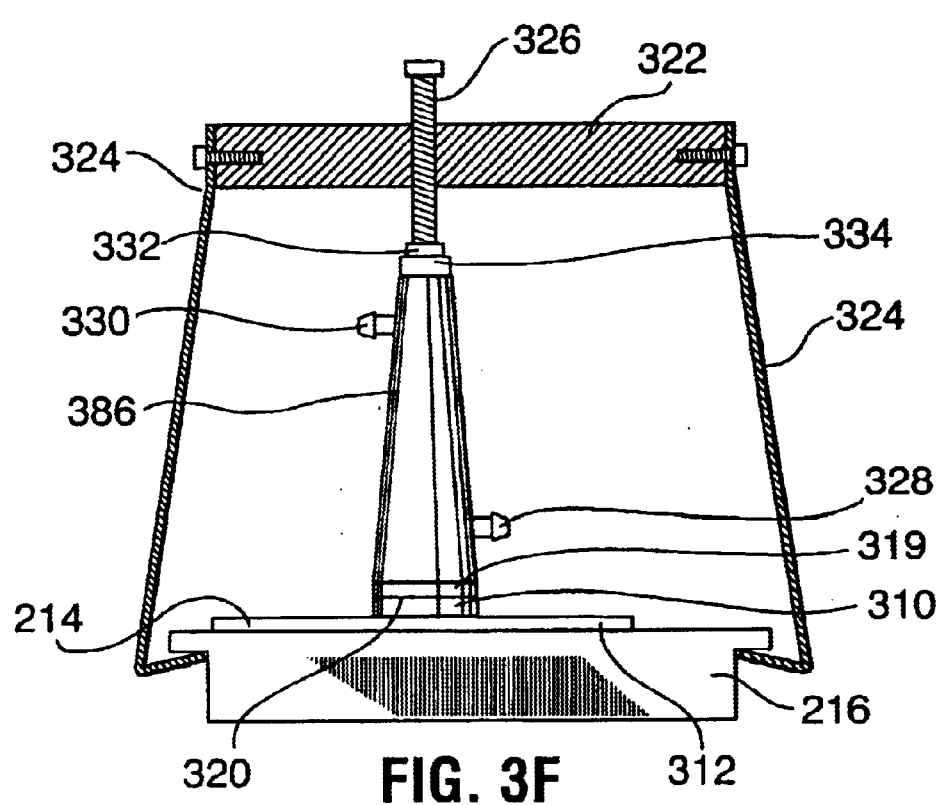

While the body 314 and the protrusion 316 are shown as cuboid in the drawings, they may be any convenient shape so long as the body 314, through which fluid is circulated, is separated from the microprocessor 214 by a sufficient distance and a face 320 is provided that is approximately dimensionally congruent with and conforms to the non-active surface 311 of the die 310. Further, in some circumstances the protrusion 316 may be eliminated or reduced to the silver cap 319. For example, in FIGS. 3C–3F a sample of some possible body shapes are shown. In those drawings, reference numerals correspond to those in FIG. 3A where there are corresponding elements. For example, in FIG. 3C, a spherical body 380 having no protrusion is shown; the face 320 is simply a flattened portion of the surface of the body 380. In FIG. 3D, an inverted truncated pyramidal body 382 is shown; the face 320 is provided by an optional silver cap 319 that is in effect a small protrusion. In FIG. 3E, a columnar body 384 is shown and in FIG. 3F, a truncated pyramidal body 386 is shown. In each case, appropriate internal passages (not shown) must be provided to circulate cooling fluid; a fluid inlet fitting 328 and a fluid outlet fitting 330 are shown in each drawing. Further, in FIG. 3A, the protrusion 316 could be cylindrical rather than rectangular in cross-section preferably ending in a face 320 that is approximately dimensionally congruent with and conforms to the non-active surface of the die 310.

One goal in designing the upright heat exchanger 218 is to provide means to conduct heat away from the die 310 and then transfer that heat to a fluid circulating through the body 314 of the upright heat exchanger 218. If a protrusion 316 is provided, it should preferably have a cross-sectional area that does not increase rapidly with distance from the die 310 and should be designed to transfer heat as efficiently as possible to the body 314, rather than to dissipate heat itself. Ideally the temperature should drop as little as possible from the non-active surface 311 to the body 314 so as to minimize the possibility of condensation forming on the protrusion 316 if the fluid circulating through the body 314 is chilled below the dew point of the ambient air. In other words, a heat-conducting path must be provided from the protrusion 316 to the circulating fluid. This path may be provided by the material out of which the upright heat exchanger 218 is formed, or by a heat pipe integrated into the upright heat exchanger 218, or by a thermoelectric heat pump placed between the die 310 and the body 314, possibly as a protrusion 316 from the body 314.

Preferably, the protrusion 316 should extend far enough from the microprocessor 214 so that the lower surface 318 of the body 314 is sufficiently distant from the surface 313 of the microprocessor 214 such that sufficient ambient air may circulate in the gap between them so as to substantially prevent condensation from forming on the surface 313 of the microprocessor 214 and from forming on and dripping from the body 314 when fluid is cooled below the dew point of the ambient air and circulated through the body 314. Just how far the fluid should be cooled depends upon how much heat needs to be conducted away from the die 310. The further the fluid is cooled, the more heat can be conducted away using the same sizes for components such as the pump module 222, 262 and the heat exchanger 218, 258. There is therefore an economic advantage in using colder fluid, but at some point the gap between the surface of the body 314 and the surface of the microprocessor 214 will no longer allow sufficient air circulation. Hence the distance that the protrusion 316 extends from the body 314 must be determined empirically based upon the amount of heat needed to be conducted away and the sizes of the components. As noted above, a discrete protrusion may not be needed if the body 314 has a shape that provides a sufficient gap between the body 314 and the surface of the microprocessor 214. Several examples of this are shown in FIGS. 3C–3G.

The inventor has found that even a small distance between the lower surface 318 of the body 314 and the surface 313 of the microprocessor 214 will allow the fluid to be cooled further than is possible using conventional heat exchangers without sealing and insulation. For example, a distance of approximately 6 mm has been found to be sufficient to allow for cooling current CPU microprocessors using circulating fluid cooled to below the dew point of the ambient air.

It is critical that (1) condensation not be allowed to form on the microprocessor 214 or other components and, (2) if condensation does form on the upright heat exchanger 218, then it does not drip or otherwise run onto the microprocessor 214 or other components. In general, heat transfer from the socket 216, the motherboard 212, or the microprocessor 214 to the body 314 should not be allowed to lower the temperature of any portion of the socket 216, the motherboard 212, or the microprocessor 214 so as to allow condensation to form on them. One way to accomplish this is to keep the gap between the body 314 and the microprocessor 214 sufficiently large that convection cells will not establish themselves in that gap under normal operating conditions so as to cause convective heat transfer. Further, the body 314 should be sufficiently exposed to ambient air flow that if condensation does form on the body 314, it will evaporate without dripping onto the microprocessor 214 or other components.

The upright heat exchanger 218 is held in place so that the face 320 of the protrusion 316 is thermally coupled to the die 310 by a clamping arrangement formed from a plastic bar 322, two stainless steel spring clips 324, and a bolt 326. The spring clips 324 hook under opposite sides of the socket 216 and extend upward to attach to opposite ends of the plastic bar 322. The plastic bar 322 is provided with an opening aligned with the center of the die 310 that is threaded to accept the bolt 326. The upright heat exchanger 218 is installed by placing the face 320 of the protrusion 316, preferably coated with thermal grease, against the non-active surface of the die 310 and then tightening the bolt 326 until the bolt 326 contacts the upright heat exchanger 218. The use of a plastic bar 322 minimizes the possibility that excessive pressure will be applied to the die 310 by tightening the bolt 326, because the plastic bar 322 will break if too much pressure is applied.

As illustrated in FIG. 3A, the upright heat exchanger 218 is also provided with a fluid inlet fitting 328 and a fluid outlet fitting 330. When installed in the PC 210 shown in FIG. 2A, the tubing indicated by reference numeral 226 is connected to the fluid inlet fitting 328 and the tubing indicated by reference numeral 228 is connected to the fluid outlet fitting 330.

Also illustrated in FIG. 3A is a screw-in plug 332 and a nylon washer 334. The top of the body 314 is provided with a threaded filler opening (not shown in FIG. 3A), which is threaded to accept the screw-in plug 332. The purpose of the threaded filler opening is discussed below, but when assembled, the nylon washer 334 is placed over the opening and the screw-in plug 332 screwed into the opening to cause the nylon washer 334 to seal the opening. The head of the screw-in plug 332 is indented so as to accept the end of the bolt 326 and align the upright heat exchanger 218 while the bolt 326 is being tightened.

In FIG. 3B, the microprocessor 254 can be seen to be of the conventional flip-chip type having a die 350 mounted in a mounting package 352. The die 350 extends above the surrounding surface 353 of the mounting package 352 and provides a non-active surface 351 that is generally parallel to the surrounding surface 353. In this type of mounting, no thermal plate is provided as part of the microprocessor 254, it being intended that a heat sink will be installed directly in contact with the non-active surface 351.

As illustrated in FIG. 3B, the horizontal heat exchanger 258 is comprised of a cuboid body 354 of copper that has a cuboid protrusion 356 extending from a face 358 adjacent and parallel to the non-active surface 351 of the die 350. As will be discussed in relation to FIGS. 5A and 5B, the body 354 contains internal passages and chambers through which a fluid may be circulated. The protrusion 356 ends in a face 360 (sometimes referred to as a surface herein), which should preferably be dimensionally substantially congruent with and conform to the non-active surface 351 of the die 350. Some of the advantages of the invention are reduced if the face 360 is not substantially congruent with the surface of the die 350. If the face 360 does not contact the entire surface of the die 350, then the rate at which heat can be transferred is reduced, although if for some reason the die 350 is not uniformly hot, this may be desirable or at least tolerable. On the other hand, if the face 360 is larger than the surface of the die 350, the disadvantages of current liquid heat exchangers such as that shown in FIG. 1C begin to appear as the difference in size increases. An empirical approach should be used to applying the present invention to a particular microprocessor installation.

The discussion above regarding variant body shapes and design goals for the upright heat exchanger 218 applies as well to the horizontal heat exchanger 258.

The horizontal heat exchanger 258 is held in place so that the face 360 of the protrusion 356 is thermally coupled to the die 350 by a clamping arrangement formed from a plastic bar 362, two stainless steel spring clips 364, and a bolt 366. The spring clips 364 hook under opposite sides of the socket 256 and extend outward to attach to opposite ends of the plastic bar 362. The plastic bar 362 is provided with an opening aligned with the center of the die 350 and threaded to accept the bolt 366. The horizontal heat exchanger 258 is installed by placing the face 360 of the protrusion 356, preferably coated with thermal grease, against the non-active surface of the die 350 and then tightening the bolt 366 until the bolt 366 contacts the horizontal heat exchanger 258. The face of the body 354 may be indented so as to accept the end of the bolt 366 and align the horizontal heat exchanger 258 while the bolt 366 is being tightened. The use of plastic minimizes the possibility that excessive pressure will be applied to the die 350 by tightening the bolt 366, as the plastic bar 362 will break if too much pressure is applied.

Figure 5A:
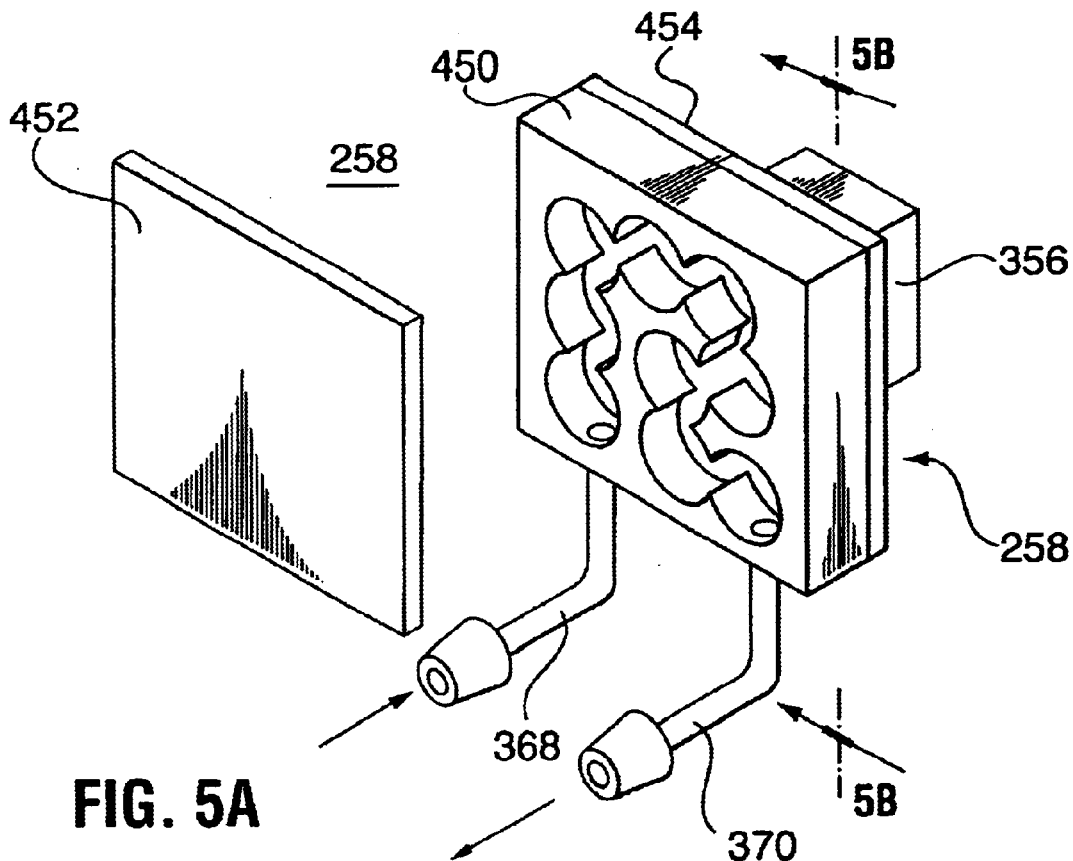
FIG. 5A is a schematic partially exploded isometric view of the fluid heat exchanger of FIG. 3B.

The horizontal heat exchanger 258 is also provided with a fluid outlet fitting 370 and a fluid inlet fitting 368, which is not visible in FIG. 3B as it is behind fluid outlet fitting 370 in the view provided in FIG. 3B (see FIG. 5A). When the horizontal heat exchanger 258 is installed in a PC 250, the tubing indicated by reference numeral 266 is connected to the fluid inlet fitting 368 and the tubing indicated by reference numeral 228 is connected to fluid outlet fitting 370.

Figure 3G:
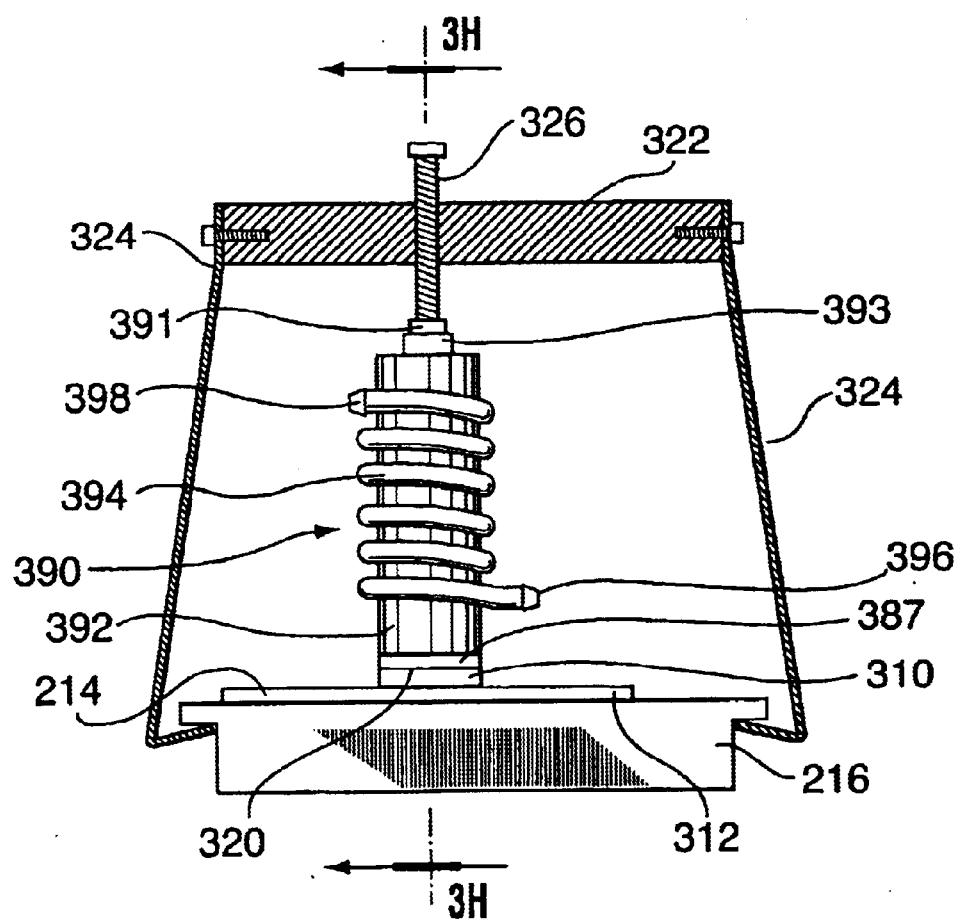
FIG. 3G is a schematic elevation view of a variant fluid heat exchanger having an external cooling conduit.
Figure 3H:
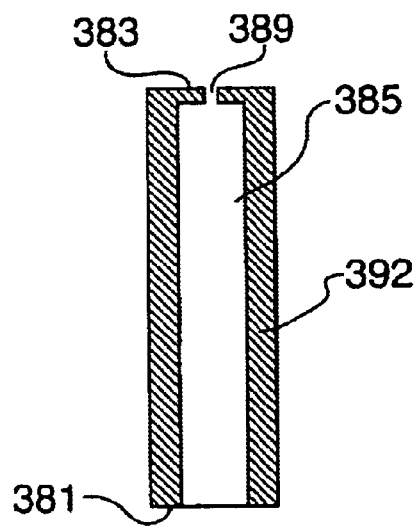
FIG. 3H is a schematic cross-sectional view of the fluid heat exchanger shown in FIG. 3G taken along line 3H—3H of FIG. 3G.

An alternative heat exchanger is shown in FIGS. 3G and 3H and indicated generally by reference numeral 390. The heat exchanger 390 has a columnar body 392 similar in shape to the columnar body 384 shown in FIG. 3E, but with cooling provided by an exterior winding of tubing 394 rather than an internal passage for circulating cooling fluid. The exterior winding of tubing 394 has an inlet 396 and an outlet 398 corresponding to the fluid inlet fitting 328 and the fluid outlet 330 fitting of the upright heat exchanger 218 of FIG. 3A, respectively. The same design criteria apply to the combination of the body 392 and the exterior winding of tubing 394 shown in FIGS. 3G and 3H as apply to the body 314 and the protrusion 316 shown in FIG. 3A. Specifically, if that combination 392/394 were used in place of the upright heat exchanger 218 of FIGS. 2A and 3A, the exterior winding of tubing 394 should preferably be located so as to reduce heat transfer from the socket 216, the motherboard 212, or the microprocessor 214 to the exterior winding of tubing 394 so that the temperature of any portion of the socket 216, motherboard 212, or the microprocessor 214 would not drop to the point at which condensation would form on them. Further, the exterior winding of tubing 394 should be sufficiently exposed to ambient air flow that if condensation does form on the tubing 394, the condensation will evaporate without dripping onto the microprocessor 214 or other components. Design dimensions are best determined empirically.

The body 392 may be either solid, preferably copper, or may be constructed as a heat pipe as shown in FIG. 3H. If so, the body 392 may be bored axially through from its bottom 381 to close to its top surface 383 forming a bored out chamber 385. A silver cap 387 may be joined to the bottom 381 as shown in FIG. 3G. A filler opening 389 passes from the chamber through the top surface 383. The filler opening 389 is threaded to receive a screw-in plug 391. The body 392 may be used as a heat pipe if the chamber 385 is evacuated, partially filled with a mixture of approximately 50% acetone, 35% isopropyl alcohol, and 15% water, and the screw-in plug 391, fitted with a nylon washer 393, is tightened to compress the nylon washer 393, thereby sealing the chamber 385. It should be noted that the heat pipe configuration illustrated in FIGS. 3G and 3H is optional; a solid body 392 may also be used.

Figure 4E:
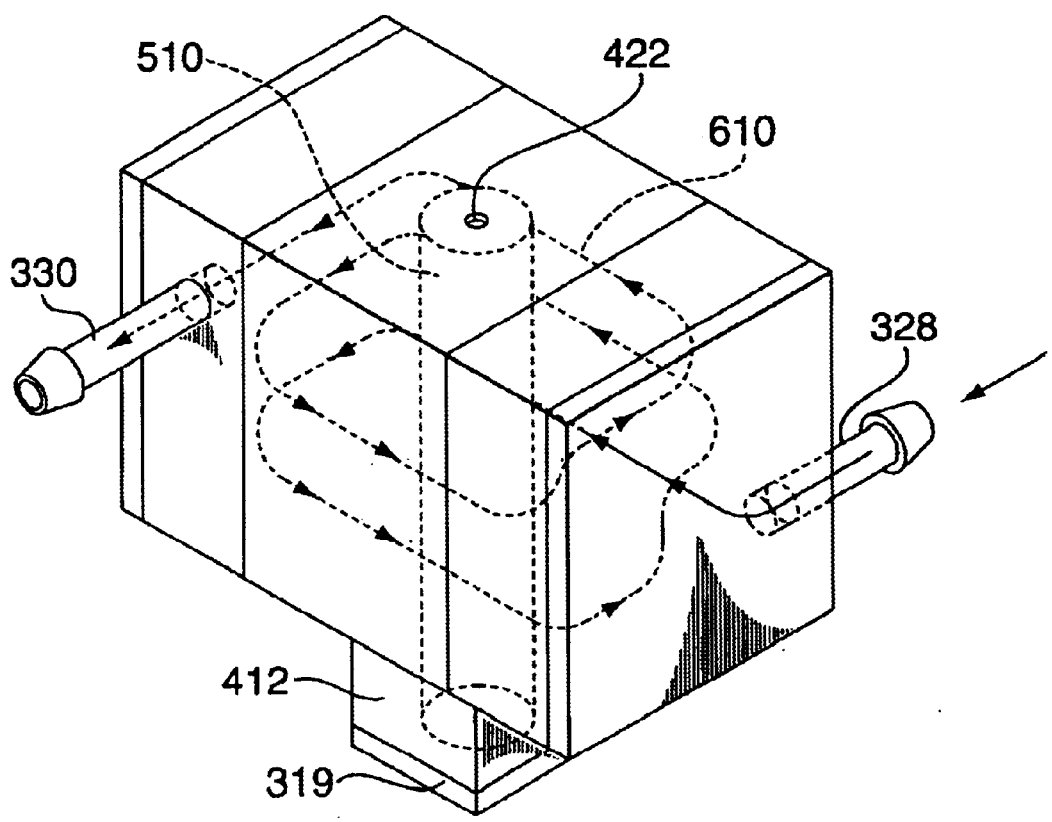
FIG. 4E is a schematic pictorial view of the fluid heat exchanger of FIG. 3A showing the internal fluid flow pattern.

As illustrated in FIG. 4A, the upright heat exchanger 218 is formed from three sections, a central section 410 from which protrudes a protruding portion 412 which together with the silver cap 319 form the protrusion 316 of FIG. 3A, an inlet side section 414, and an outlet side section 416. The three sections are bored through in the pattern shown in FIG. 4A and FIGS. 4B, 4C, and 4D. An inlet end cap 418 covers the inlet side section 414 and an outlet end cap 420 covers the outlet side section 416. When in operation, fluid entering the inlet side section 414 through the fluid inlet fitting 328 flows in a generally spiral pattern 610 as shown in FIG. 4E and leaves the upright heat exchanger 218 through the fluid outlet fitting 330.

As illustrated in FIG. 4C, the central section 410 has an axial bore or chamber 510 that extends from the face 511 of the protruding portion 412 through the central section 410 nearly to the top surface 513 of the central section 410. A threaded filler opening 422 passes from the chamber 510 through the top surface of the central section 410. The threaded filler opening 422 is threaded to receive the screw-in plug 332. When the silver cap 319 is joined to the lower face 511 of the protruding portion 412 and the screw-in plug 332 tightened to compress the nylon washer 334, the chamber 510 is sealed and may be used as a heat pipe if evacuated and partially filled with a mixture of approximately 50% acetone, 35% isopropyl alcohol, and 15% water.

Figure 5B:
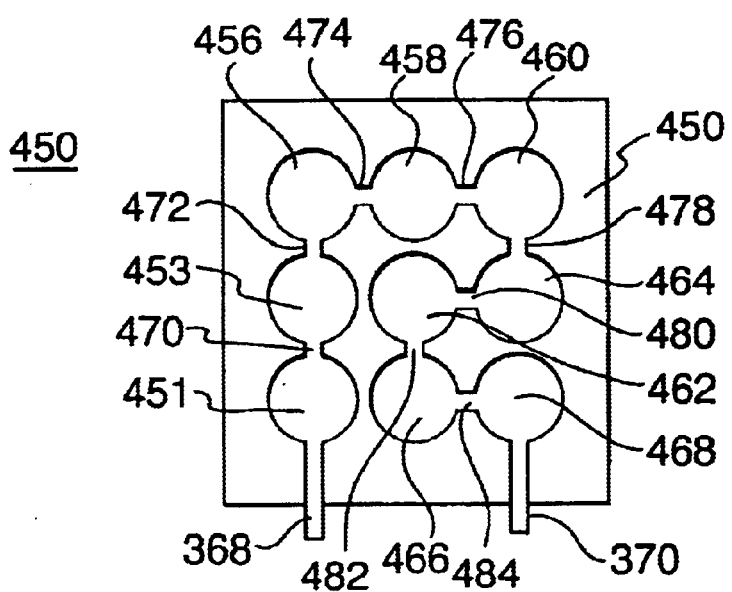
FIG. 5B is a schematic cross-section of the fluid heat exchanger of FIG. 5A taken along line 5B—5B of FIG. 5A.

FIG. 5A and FIG. 5B illustrate the structure of the horizontal heat exchanger 258 in more detail. The horizontal heat exchanger 258 does not include a heat pipe such as that provided by the chamber 510 in the upright heat exchanger 218, nor does it include a silver cap 319. It comprises a central block 450 bored through by nine parallel bores that are laterally connected in the manner shown in FIG. 5B to form a passage from the fluid inlet fitting 368 to the fluid outlet fitting 370. End caps 452, 454 cover the faces of the central block 450 through which the central block 450 is bored. The end cap indicated by reference numeral 454 covers the face of the central block 450 closest to the die 350. A protrusion 356 is attached to the outer face of end cap 454. The end cap indicated by reference numeral 452 covers the other face of the central block 450 and may have a small indentation on its outer face to assist in aligning horizontal heat exchanger 258 during installation.

While the upright heat exchanger 218 and the horizontal heat exchanger 258 have been shown in the drawings and described as intended for installation in an upright and a horizontal orientation, respectively, those skilled in the art will understand that the horizontal heat exchanger 258 could be installed in an upright orientation and the upright heat exchanger 218 could be installed in a horizontal orientation. However, in the case of the upright heat exchanger 218, suitable wicking (not shown) would then have to be provided in the heat pipe chamber 510, as gravity would not cause condensed liquid to flow back toward the protrusion 412. The heat pipe chamber 510 and more elaborate construction of the upright heat exchanger 218 may not be warranted in all cases. Hence the designer may wish to use the horizontal heat exchanger 258 wherever a simple, less expensive heat exchanger is desired, in both horizontal and upright orientations.

In both the upright heat exchanger 218 and the horizontal heat exchanger 258, a passage provided for the circulation of a fluid is comprised of a series of cylindrical chambers connected by constrictions. For example, in FIG. 5B fluid entering the horizontal heat exchanger 258 through fluid inlet fitting 368 passes through nine chambers 451, 453, 456, 458, 460, 462, 464, 466, 468 before leaving through fluid outlet fitting 370. Each pair of successive chambers is connected by a constriction. The constrictions in FIG. 5B are indicated by reference numerals 470, 472, 474, 476, 478, 480, 482, and 484. For example, in FIG. 5B constriction 470 connects the first pair of chambers 451, 453. The chambers 451, 453, 456, 458, 460, 462, 464, 466, 468 pass completely through section 450 and may be formed by boring through solid copper blocks, although casting or other methods may be used depending upon the material used. The constrictions also pass completely through the section 450, so that each of the chambers connected by the constriction has an opening in its interior wall passing into the constriction having a boundary defined by two lines along the interior wall of the chamber that run parallel to the axis of the chamber that are connected by segments of the edges of the circular ends of the chamber. The area of the opening should preferably by approximately equal to the cross-section area of the fluid inlet fitting 368 and the fluid outlet fitting 370.

While the chambers 451, 453, 456, 458, 460, 462, 464, 466, 468 shown in FIG. 5B and the chambers shown in FIGS. 4B and 4D are drawn so that the axes of successive pairs of chambers are spaced apart by a distance that is somewhat greater than the diameter of one chamber, it is also within the scope of the invention to space the axes of successive chambers closer to each other or farther apart. For example, in FIGS. 4A and 5A, the axes of successive chambers are close enough to each other that the constrictions between successive chambers are formed by the overlapping of the chambers. One method for forming such chambers and constrictions is to bore a block of material so that the center of each bore is closer to the next successive bore than the diameter of the bore.

Figure 6A:
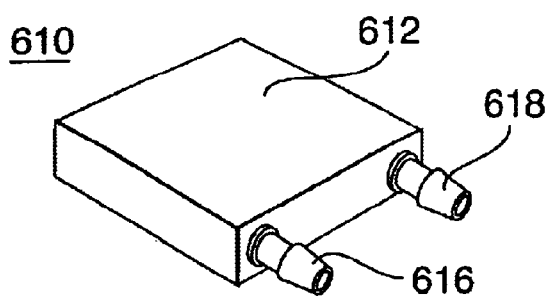
FIG. 6A is a schematic isometric view of a molded or cast one-piece fluid heat exchanger in accordance with the present invention.
Figure 6C:
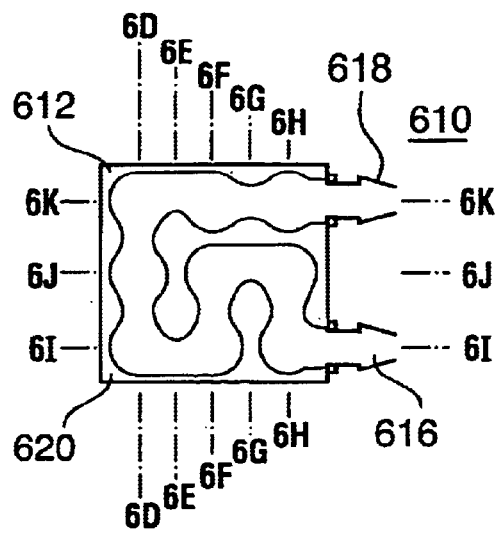
FIG. 6C is a schematic cross-sectional view of the fluid heat exchanger of FIG. 6A taken along line 6C—6C of FIG. 6B.
Figure 6B:
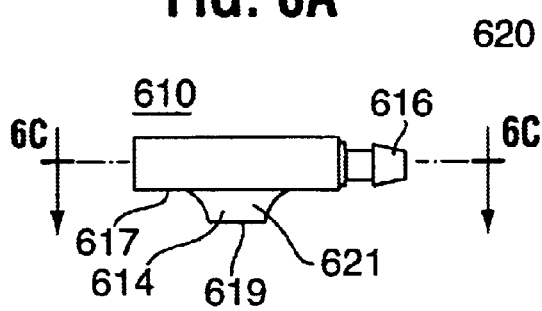
FIG. 6B is a schematic elevation view of the fluid heat exchanger of FIG. 6A.
Figure 6D:
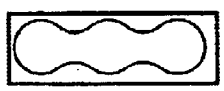
FIGS. 6D, 6E, 6F, 6G, 6H, 6I, 6J, and 6K are schematic cross-sections of the fluid heat exchanger of FIG. 6A taken along lines 6D—6D, 6E—6E, 6F—6F, 6G—6G, 6H—6H, 6I—6I, 6J—6J, and 6K—6K of FIG. 6C, respectively. The barbs and protrusion are not shown.
Figure 6H:
Figure 6E:
Figure 6I:
Figure 6F:
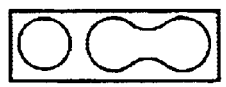
Figure 6J:
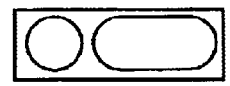
Figure 6G:
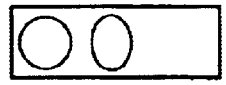
Figure 6K:
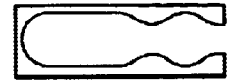

The inventor has found that the one-piece fluid heater exchanger indicated generally by reference numeral 610 in FIGS. 6A–6C is less costly to manufacture than the fluid heat exchangers 218, 258 shown in FIGS. 3A and 3B and described above and maybe used in place of fluid heat exchangers 218, 258 in many applications. However, the same design principles apply. The heat exchanger 610 shown in FIGS. 6A–6C is die cast in one piece from an aluminum alloy such as 1106 alloy or 6101 alloy using processes that are known to those skilled in the art. That process is not within the scope of the invention, although the arrangement and shapes of the internal passages are within the scope of the invention. The heat exchanger 610 shown in FIGS. 6A–6C might also be formed by molding heat-conducting plastic material.

The heat exchanger 610 shown in FIGS. 6A, 6B, and 6C comprises a cuboid body 612, a protrusion 614, an inlet barb 616, and an outlet barb 618, all of which are die cast as a unitary structure. The protrusion 614 provided complies with the design guidelines discussed above, extending from the lower face 617 of the body 612 and having a face or surface 619 for coupling thermally to the non-active surface of a die. The perpendicular distance between the plane of the surface 619 and the lower face 617 is approximately 6.25 mm. The four sidewalls of the protrusion 614, the face of one of which is indicated by reference numeral 621, are concave with a radius of curvature of approximately 6.25 mm, resulting in the sidewalls 621 being perpendicular to the plane of the surface 619 at their line of contact with it. The inventor has found that for currently available microprocessors, this perpendicular distance and sidewall design works. However, an empirical approach is recommended if the circulating fluid is chilled to lower temperatures. For example, steeper sidewalls, greater perpendicular distance, or both, may be needed.

As illustrated in FIG. 6C, inside the body 612 a passage 620 through which chilled fluid may be circulated is provided. The passage 620 connects the opening in the inlet barb 616 to the opening in the outlet barb 618. The passage 620 comprises a series of nine generally spherical chambers connected by eight cylindrical constrictions. FIGS. 6D–6K provide a set of cross-sections showing the shapes and relative diameters of the spherical chambers and cylindrical constrictions. The transitions between the spherical chambers and constrictions are smooth. Because the body 612 and the protrusion 614 are formed as a unitary structure from heat-conducting material, a heat-conducting path is provided from the surface 619 to the material of the body 612 adjacent the passage 620 so that heat may flow from the die to fluid circulated through the passage 620.

Figure 7A:
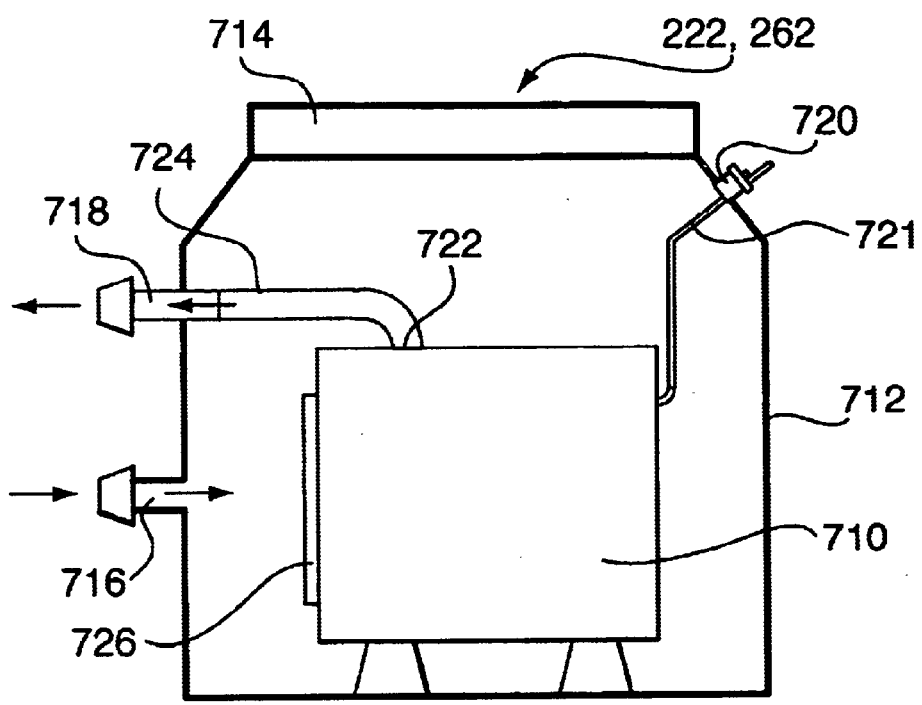
FIG. 7A is a schematic elevation view of the pump/tank module of the cooling apparatus of FIGS. 2A and 2B.

A pump module 222, 262 that may be constructed from commercially available components is shown in detail in FIG. 7A. The pump module 222, 262 generally comprises a conventional submersible 12-volt AC pump 710 installed inside a conventional tank 712. The tank 712 has a screw-on lid 714, an inlet fitting 716, an outlet fitting 718, and a compression fitting 720. The outlet 722 of the pump 712 is connected to the outlet fitting 718 by tubing 724. The inlet 726 of the pump 712 is open to the interior of the tank 712 as is the inlet fitting 716. The power cord 721 of the pump 710 is lead through the compression fitting 720 to a suitable power supply outside the case of the PC 210, 250, or alternatively an inverter (not shown) may be provided inside the case of the PC 210, 250 to provide 12 volt AC from the DC power supply of the PC 210, 250. The tank 712 may be initially filled with fluid by removing the screw-on lid 714. The preferred fluid is 50% propylene glycol and 50% water. The tank 712 should be grounded to reduce the risk of a static electrical charge building up and causing sparking. Preferably this should be accomplished by the use of a tank 712 composed of metalized plastic, although a metal plate connected to the case of the PC 210, 250 may be used.

Figure 7B:
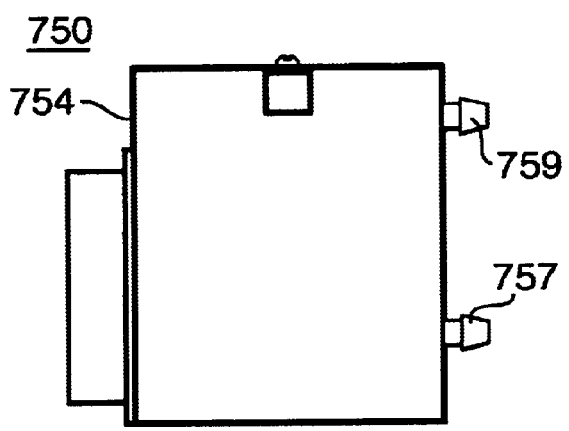
FIG. 7B is a schematic side elevation view of a molded pump/tank module that could be included in the cooling apparatus of FIGS. 2A and 2B.
Figure 7C:
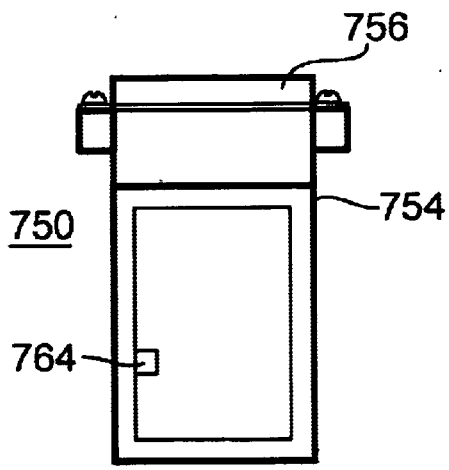
FIG. 7C is a schematic end elevation view of the pump/tank module of FIG. 7B.
Figure 7D:
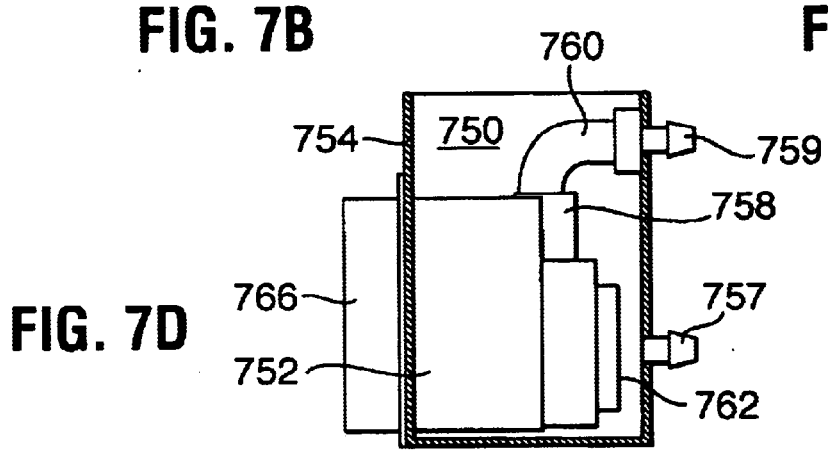
FIG. 7D is a schematic internal side elevation view of the pump/tank module of FIG. 7B.

In FIGS. 7B, 7C, and 7D, a variant pump module indicated generally by reference numeral 750 is shown that includes a pump having a center-tapped motor winding and an inverter. The inverter is disclosed in a copending, commonly-owned application entitled "Inverter" having application number (to be assigned), which is incorporated herein by reference. It generally comprises a submersible 20-volt AC pump 752 installed inside a tank 754. The tank 754 has a lid 756, an inlet fitting 757, and an outlet fitting 759. The outlet 758 of the pump 752 is connected to the outlet fitting 759 by heater pipe 760. The inlet 762 of the pump 752 is open to the interior of the tank 750 as is the inlet fitting 757. A power cord from the DC power supply of the PC 210, 250 may be lead through an access opening 764 to connect to an inverter 766. The tank 754 may be initially filled with fluid by removing the lid 756. The preferred fluid is 50% propylene glycol and 50% water. The tank 754 should be grounded to reduce the risk of a static electrical charge building up and causing sparking. Preferably this should be accomplished by the use of a tank 754 composed of metalized plastic.

Figure 8:
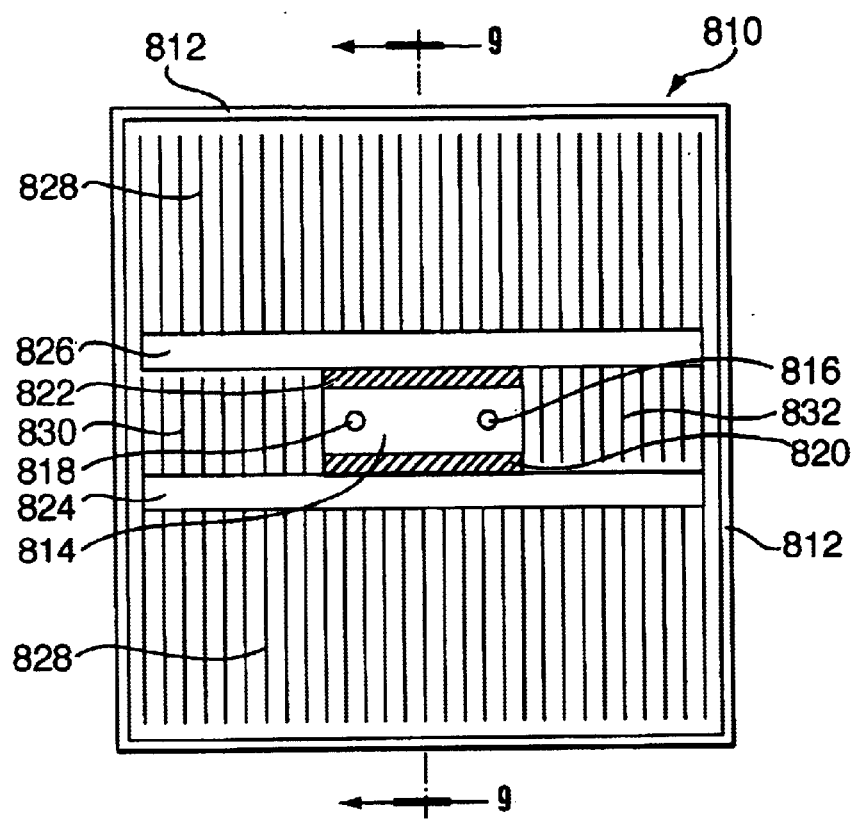
FIG. 8 is a schematic end elevation view of a copper-finned chiller module in accordance with the invention, with the fan removed. The view is taken in the direction of airflow when chiller module is in operation.
Figure 9:
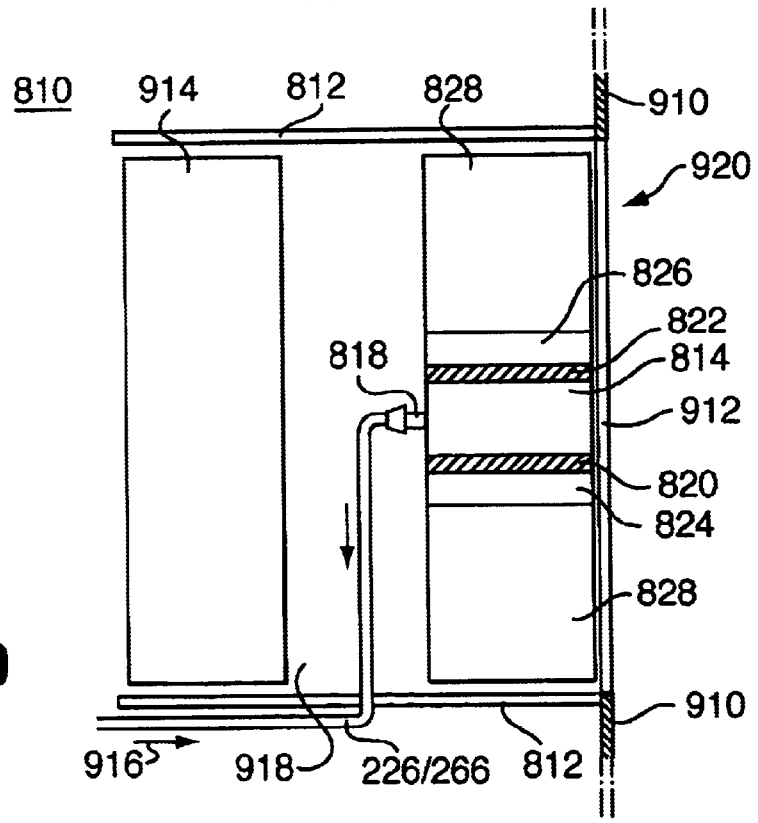
FIG. 9 is a schematic longitudinal section of the chiller module of FIG. 8 taken along line 9—9 of FIG. 8.
Figure 13:
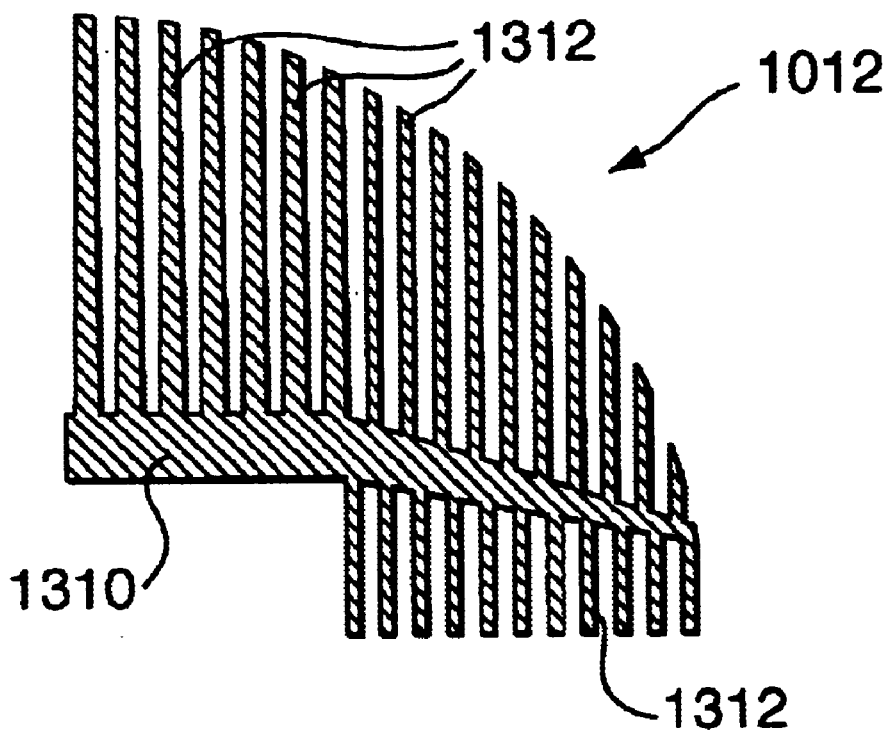
FIG. 13 is a cross-section of one of the four extruded fin sections of the chiller module of FIG. 10.
Figure 14:
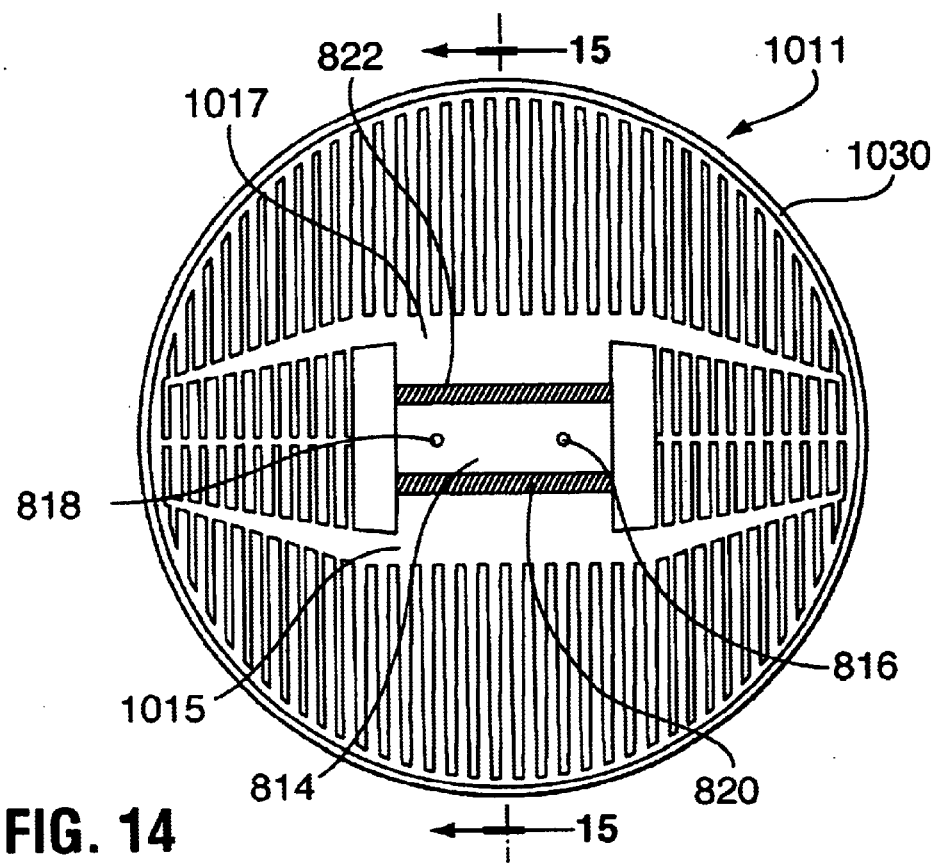
FIG. 14 is a schematic end elevation view of an aluminum-finned chiller module having two extruded fin sections, in accordance with the invention. The view is taken with the fan removed and in the direction of airflow when chiller module is in operation.
Figure 15:
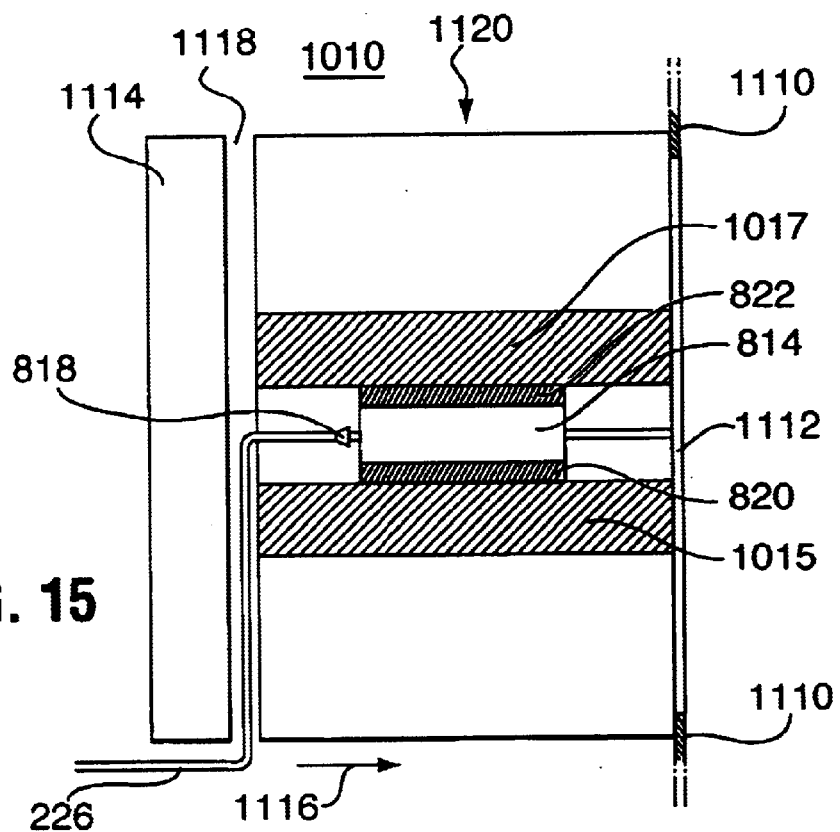
FIG. 15 is a longitudinal cross-section of the chiller module of FIG. 14 taken along line 15—15 of FIG. 14.
Figure 16:
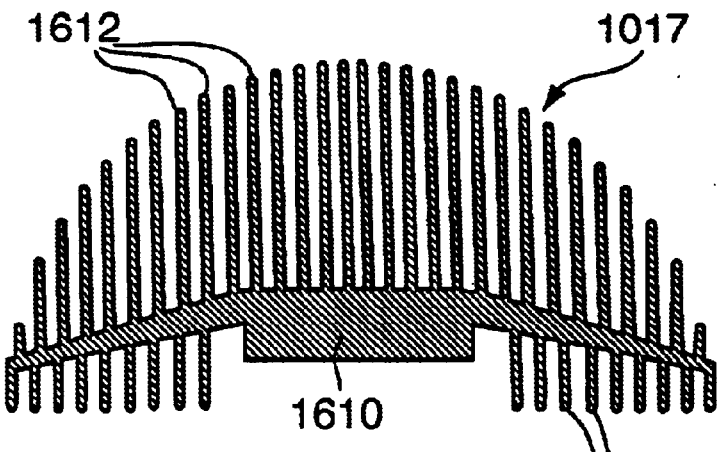
FIG. 16 is a cross-section of one of the two extruded fin sections of the chiller module of FIG. 14.

Two basic designs for the chiller module 220, 260 are shown in the drawings. FIGS. 8 and 9 illustrate a copper-finned chiller 810, while FIGS. 10–13 illustrate a cylindrical aluminum-finned chiller 1010. FIGS. 14–16 illustrate a variant of the cylindrical aluminum-finned chiller 1010. Both chiller designs include a chiller heat exchanger 814 shown in FIG. 17 or may use the chiller heat exchanger 1810 shown in FIGS. 18A–18J in place of the chiller heat exchanger 814 shown in FIG. 17.

As shown in FIGS. 8 and 9, the copper-finned chiller 810 generally comprises a housing 812 for mounting in alignment with an opening 912 in a wall 910 of the case of the PC 210, 250, a conventional 12 volt DC fan 914, a chiller heat exchanger 814 having a chiller inlet fitting 816 and a chiller outlet fitting 818, two conventional thermoelectric heat pumps 820, 822, which are connected to the power supply of the PC 210, 250 (connection not shown), two copper base plates 824, 826, and a plurality of fins 828. An arrow 916 in FIG. 9 shows the direction of airflow. When installed in the case of the PC 210, 250, the chiller inlet fitting 816 is connected to the tubing indicated by reference numerals 224, 264 and the chiller outlet fitting 818 is connected to the tubing indicated by reference numerals 226, 266.

The chiller heat exchanger 814, essentially a block through which a chilled fluid may be circulated, is discussed in the detail below in reference to FIG. 17. In the copper-finned chiller 810, the chiller heat exchanger 814 is sandwiched between the cold sides of the two thermoelectric heat pumps 820, 822 so that a large proportion of the surface area of the chiller heat exchanger 814 is thermally coupled to the cold sides of the thermoelectric heat pumps 820, 822. The assembly of the chiller heat exchanger 814 and the thermoelectric heat pumps 820, 822 is in turn sandwiched between the two copper base plates 824, 826 so that the hot sides of the thermoelectric heat pumps 820, 822 are thermally coupled to the copper base plates 824, 826, respectively. The sides of the copper base plates 824, 826 that are not thermally coupled to the hot sides of the thermoelectric heat pumps 820, 822 are joined by soldering or brazing to a plurality of parallel spaced apart fins 828 that are generally perpendicular to the sides of the copper base plates 824, 826.

As illustrated in FIG. 9, a buffer zone 918 is provided between the fan 914 and the finned assembly, indicated generally by reference numeral 920, that includes the chiller heat exchanger 814, the thermoelectric heat pumps 820, 822, the base plates 824, 826, and the fins 828. The purpose of the buffer zone 918 is to allow air flow from the circular outlet of the fan 914 to reach the corners of the finned assembly 920, which has a square cross-section as shown in FIG. 8.

Optionally, as shown in FIG. 8, a plurality of parallel spaced apart fins 830 may be joined to a portion of the side of a copper base plate 824 that is thermally coupled to the hot side of the thermoelectric heat pump 820, but that is not in contact with the hot side of the thermoelectric heat pump 820. Also optionally, a plurality of parallel spaced apart fins 832 may be joined to a portion of the side of the copper base plate 826 that is thermally coupled to the hot side of the thermoelectric heat pump 822, but that is not in contact with the hot side of the thermoelectric heat pump 822. If the fins 830 and 832 are omitted, then the space that they would otherwise occupy should be blocked so as to force airflow to pass between the fins 828.

In operation, the copper-finned chiller 810 chills fluid that has picked up heat from the microprocessor 214, 254 and is pumped through the chiller heat exchanger 814. The cold sides of the two thermoelectric heat pumps 820, 822 absorb heat from the chiller heat exchanger 814 and pump it to their respective hot sides. The copper base plates 824, 826 in turn transfer that heat to the fins 828, 830, 832. Air, forced between the fins 828, 830, 832 by the fan 914 picks up heat from the fins 828, 830, 832 and carries that heat out of the case of the PC 210, 250.

Figure 10:
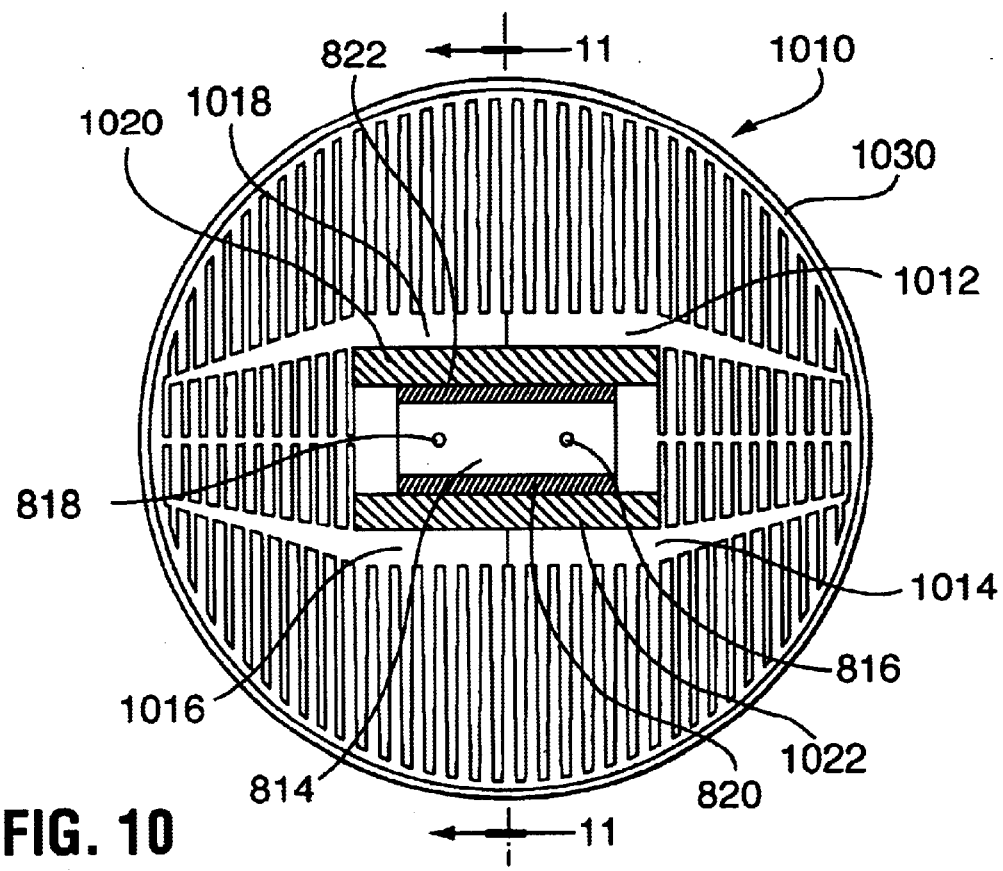
FIG. 10 is a schematic end elevation view of an aluminum-finned chiller module having four extruded fin sections, in accordance with the invention. The view is taken with the fan removed and in the direction of airflow when chiller module is in operation.
Figure 11:
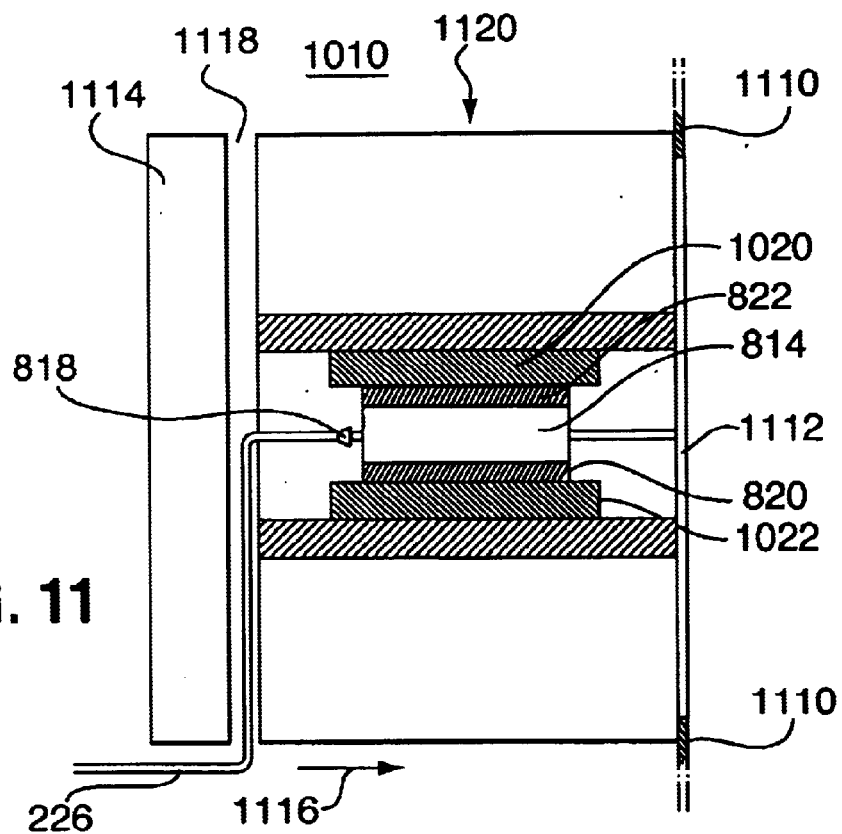
FIG. 11 is a longitudinal cross-section of the chiller module of FIG. 10 taken along line 11—11 of FIG. 10.
Figure 12:
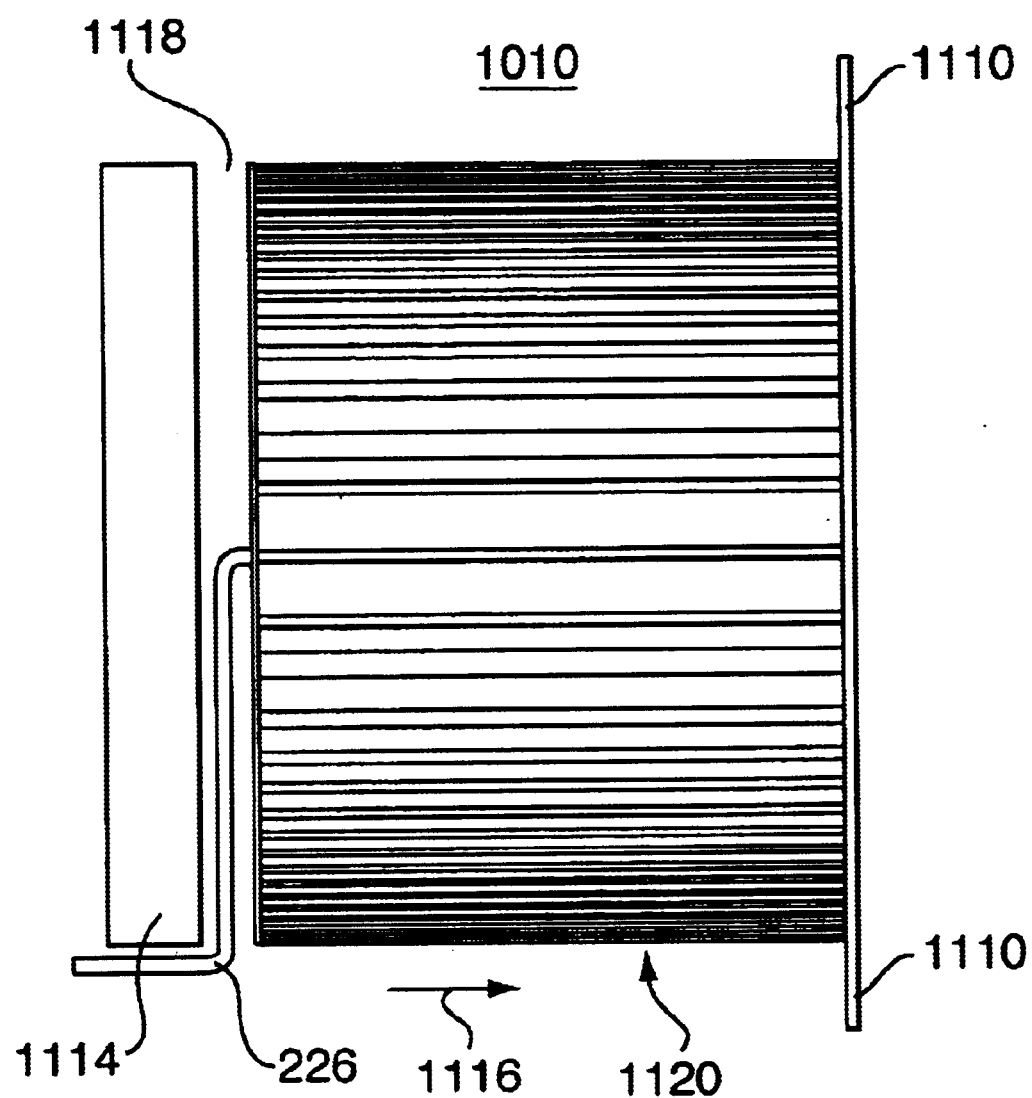
FIG. 12 is a side elevation view of the chiller module of FIG. 10 with the housing removed.

The cylindrical aluminum-finned chiller 1010 shown in FIGS. 10, 11, and 12 may be used in place of the copper-finned chiller 810. The basic difference between the two designs is in the use of four aluminum extrusions 1012, 1014, 1016, 1018 to replace the fins 828, 830, 832 of the copper-finned chiller 810. The chiller heat exchanger 814 and the two thermoelectric heat pumps 820, 822 used in the copper-finned chiller 810 may be used in the cylindrical aluminum-finned chiller 1010 and are indicated by the same reference numerals. Two copper heat spreader plates 1020, 1022 correspond generally to the copper base plates 824, 826 of the copper-finned chiller 810.

As shown in FIGS. 10–13, the aluminum-finned chiller 1010 generally comprises a cylindrical housing 1030 that may be attached to a wall 1110 of the case of the PC 210, 250 in alignment with an opening 1112 in the wall 1110, a conventional 12 volt DC fan 1114, the chiller heat exchanger 814 having a chiller inlet fitting 816 (visible only in FIG. 10) and a chiller outlet fitting 818, the two thermoelectric heat pumps 820, 822, which are connected to the power supply of the PC 210, 250 (connection not shown), two copper heat spreader plates 1020, 1022, and the four aluminum extrusions 1012, 1014, 1016, 1018. An arrow 1116 in FIG. 11 shows the direction of airflow. When installed in the case of the PC 210, 250, the chiller inlet fitting 816 is connected to the tubing indicated by reference numerals 224, 264 and the chiller outlet fitting 818 is connected to tubing indicated by reference numerals 226, 266.

As illustrated in FIG. 11, a buffer zone 1118 is provided between the fan 1114 and the finned assembly, indicated generally by reference numeral 1120, that includes the chiller heat exchanger 814, the thermoelectric heat pumps 820, 822, the heat spreader plates 1020, 1022, and the aluminum extrusions 1012, 1014, 1016, 1018. The buffer zone 1118 shown in FIG. 11 is much smaller than the buffer zone 918 shown in FIG. 9 as both the fan 1114 and the finned assembly 1120 has approximately the same circular cross-sectional area so that little or no buffer zone 1118 is needed to provide airflow to the finned assembly 1120. However, the buffer zone 1118 provides space for the tubing indicated by reference numerals 224, 264 and tubing indicated by reference numerals 226, 266 to connect to the chiller heat exchanger 1024. Reduction in the size of the buffer zone provides a more compact chiller.

The chiller heat exchanger 814, essentially a block through which a fluid to be chilled can be circulated, is discussed in the detail below in reference to FIG. 17. In the aluminum-finned chiller 1010, the chiller heat exchanger 814 is sandwiched between the two thermoelectric heat pumps 820, 822 so that a large proportion of its surface area is thermally coupled to the cold side of one or the other of the thermoelectric heat pumps 820, 822. The assembly of the chiller heat exchanger 814 and the thermoelectric heat pumps 820, 822 is in turn sandwiched between the two copper heat spreader plates 1020, 1022 so that the hot sides of the thermoelectric heat pumps 820, 822 are thermally coupled to one or the other of the copper heat spreader plates 1020, 1022. The four aluminum extrusions 1012, 1014, 1016, 1018 take the place of the fins 828, 830, 832 of the copper-finned chiller 810, and are preferred because they may be extruded as units rather than joined by soldering or brazing to the copper base plates 824, 826 as in the case of the fins 828, 830, 832 of the copper-finned chiller 810 and are formed from less expensive material (aluminum, rather than copper).

Aluminum extrusions 1012, 1014, 1016, 1018 are actually all identical, being merely rotated about a horizontal or vertical plane. Therefore, FIG. 13, which is a cross-section through the aluminum extrusion 1012, illustrates all of them. As illustrated in FIG. 13, the aluminum extrusion 1012 comprises a base 1310 from which a plurality of fins 1312 protrude.

In operation, the aluminum-finned chiller 1010 chills fluid that has picked up heat from the microprocessor 214, 254 and is pumped through the chiller heat exchanger 814. The cold sides of the two thermoelectric heat pumps 820, 822 absorb heat from the chiller heat exchanger 814 and pump it to their respective hot sides. The copper heat spreader plates 1020, 1022 in turn transfer that heat to the four aluminum extrusions 1012, 1014, 1016, 1018. Air, forced between the fins 1312 by the fan 1114 picks up heat from the fins 1312 and carries that heat out of the case of the PC 210, 250.

FIGS. 14, 15, and 16 illustrate a variant, indicated generally by reference numeral 1011 of the aluminum-finned chiller 1010 of FIGS. 10–13 in which the copper heat spreader plates 1020, 1022 are omitted and the four aluminum extrusions 1012, 1014, 1016, 1018 are replaced by two identical aluminum extrusions 1015 and 1017. FIG. 14 corresponds to FIG. 10, FIG. 15 to FIG. 11, and FIG. 16 to FIG. 13. The elevation view of the aluminum-finned chiller 1010 provided in FIG. 12 is identical for the variant 1011. Aluminum extrusion 1017 is shown in cross-section in FIG. 16. As illustrated in FIG. 16, the aluminum extrusion 1017 comprises a base 1610 from which a plurality of fins 1612 protrude. The base 1610 is thicker than base 1310; the extra thickness replacing the copper heat spreader plate 1020.

In operation, the variant aluminum-finned chiller 1011 chills fluid that has picked up heat from the microprocessor 214, 254 and is pumped through the chiller heat exchanger 814. The cold sides of the two thermoelectric heat pumps 820, 822 absorb heat from the chiller heat exchanger 814 and pump it to their respective hot sides. The hot sides of the two thermoelectric heat pumps 820, 822 in turn transfer that heat to the two aluminum extrusions 1015, 1017. Air, forced between the fins 1612 by the fan 1114 picks up heat from the fins 1612 and carries that heat out of the case of the PC 210, 250.

Figure 17:
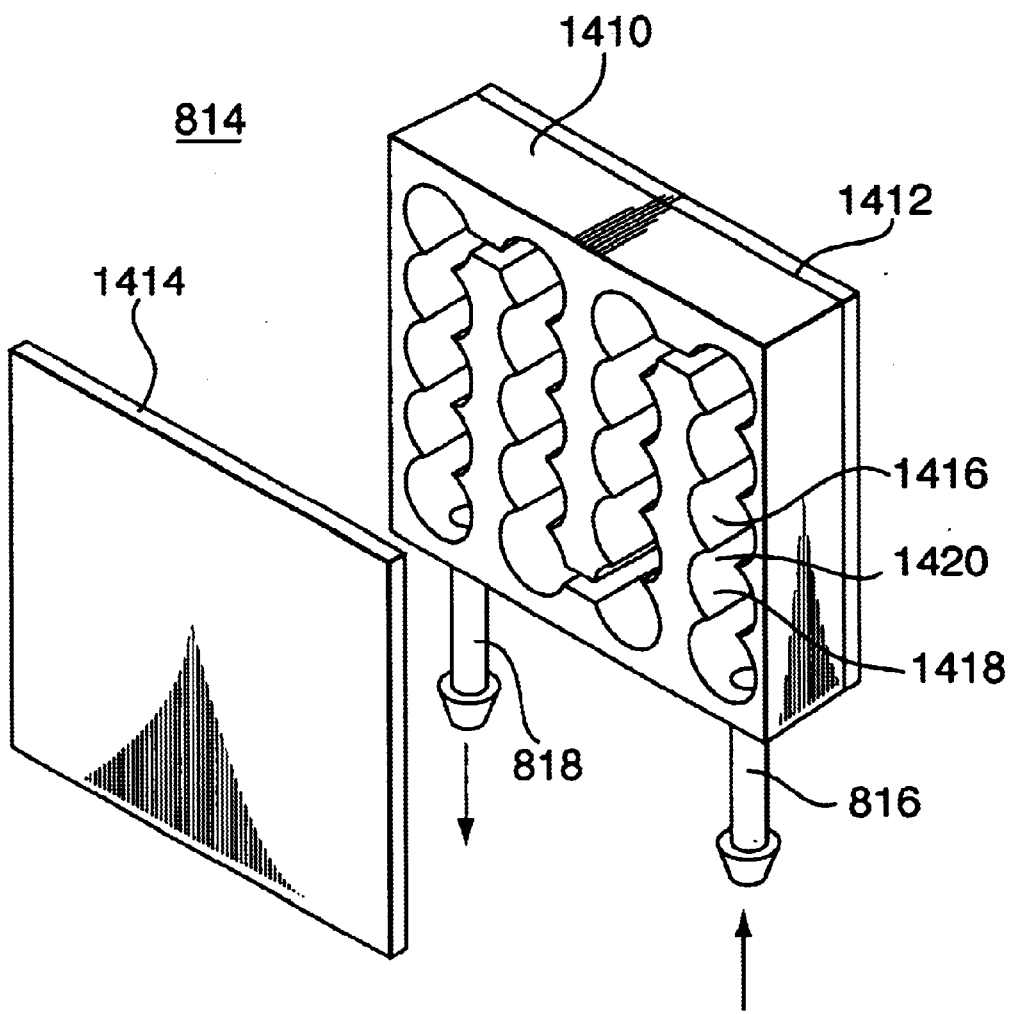
FIG. 17 is a partially exploded isometric view of a bored fluid heat exchanger for use in the chiller modules of FIGS. 8, 10, and 14.

As illustrated in FIG. 17, the structure of the chiller heat exchanger 814 is, in general, similar to that of the horizontal heat exchanger 258 described above in relation to FIGS. 5A and 5B; the primary differences being that no protrusion 356 is provided and there are 20 chambers. Chiller heat exchanger 814 comprises a central block 1410 bored through by 20 bores that are laterally connected in the manner shown in FIG. 17 to form a passage from the chiller inlet fitting 816 to the chiller outlet fitting 818. An end cap 1412, 1414 covers each face of the central block 1410. A passage is provided for the circulation of a fluid that is comprised of a series of cylindrical chambers, two representative ones of which are referred to by reference numerals 1416 and 1418, connected by constrictions, a representative one of which is referred to by reference numeral 1420.

In FIG. 17 fluid entering the chiller heat exchanger 814 through the chiller inlet fitting 816 passes through the 20 chambers before leaving through the chiller outlet fitting 818. Each pair of successive chambers is connected by a constriction. For example, in FIG. 17 the constriction 1420 connects the pair of chambers 1416 and 1418. The chambers pass completely through the central block 1410 and may be formed by boring through a solid copper block, although casting or other methods may be used depending upon the material used. The constrictions, such as constriction 1420 also pass completely through the central block 1410, so that each of the chambers connected by the constriction has an opening in its interior wall passing into the constriction having a boundary defined by two lines along the interior wall of the chamber that run parallel to the axis of the chamber that are connected by segments of the edges of the circular ends of the chamber. The area of the opening should preferably by approximately equal to the cross-section area of the chiller inlet fitting 816 and the chiller outlet fitting 818.

While the chambers shown in FIG. 17 are shown so that the axes of most of the successive pairs of chambers are spaced apart by slightly less than the diameter of one chamber so that most of the constrictions between successive chambers are formed by the overlapping of the chambers, it is also within the scope of the invention to space the axes of successive chambers farther apart, as shown in FIG. 5B. One method for forming such chambers and constrictions is to bore a block of material so that the center of each bore is closer to the next successive bore than the diameter of the bore.

While twenty chambers are shown in FIG. 17, more or fewer chambers could be used and are within the scope of this invention.

As in the case of the one-piece fluid heater exchanger 610 shown in FIGS. 6A–6C, the inventor has found that the one-piece chiller heat exchanger indicated generally by reference numeral 1810 in FIGS. 18A–18C is less costly to manufacture than the chiller heat exchanger 814 shown in FIG. 17 and described above and may be used in place of heat exchanger 814 in many applications. However, the same design principles apply. The heat exchanger 1810 shown in FIGS. 6A–6C is die cast in one piece from an aluminum alloy such as 1106 alloy or 6101 alloy using processes that are known to those skilled in the art. That process is not within the scope of the invention, although the arrangement and shapes of the internal passages are within the scope of the invention. The heat exchanger 1810 shown in FIGS. 18A–18C might also be formed by molding heat conducting plastic material.

The heat exchanger 1810 shown in FIGS. 18A, 18B, and 18C comprises a body 1812, an inlet barb 1816, and an outlet barb 1818, all of which are die cast as a single unitary structure. Inside the body 1812 a passage 1820 shown in FIG. 18C connects the opening in the inlet barb 1816 to the opening in the outlet barb 1818. The passage 1820 comprises a series of sixteen spherical chambers connected by fifteen cylindrical constrictions. More or fewer chambers could be used and are within the scope of this invention. FIGS. 18D–18J provide a set of cross-sections showing the shapes and relative diameters of the spherical chambers and cylindrical constrictions. The transitions between the spherical chambers and constrictions are smooth.

The inventor has found it advantageous to use the molded retainer shown in FIGS. 19A, 19B, and 19C for coupling the fluid heat exchanger 218, 258, 612 to a microprocessor. The molded retainer, generally indicated by reference numeral 1910, may be used instead of the plastic bar 322 and spring clips 324 in FIG. 3A and the plastic bar 362 and spring clips 364 shown in FIG. 3B. The molded retainer 1910 comprises a plate 1912 of plastic material having a front hook 1914 and a rear hook 1916 that extend perpendicularly from the plate 1912 and perform the same function as the spring clips 324, 364. Portions of the hooks 1914, 1916 near the ends that do not hook to the socket 216, 256 are embedded in the plate 1912 rather than fastened to the edges of the plate 1912 by screws as is the case in the plastic bar 322, 362 and spring clips 324, 364 shown in FIGS. 3A and 3B. Further, the ends of the hooks 1914 and 1916 that do not hook to the socket 216, 256 are bent back after they emerge from the plate 1912 and extend perpendicularly from the plate 1912 to form side brackets 1918. The side brackets 1918 extend far enough to restrain the body of the fluid heat exchanger from twisting. Two further side brackets 1920 each having a end molded into the plate 1912 are provided so that the body of the fluid heat exchanger is surrounded on all four sides by brackets 1918, 1920. The hooks 1914, 1918 and brackets 1918, 1920 are preferably made from 26 gauge sheet steel. As in the case of the plastic bar 322, 362, the plate 1912 is provided with an opening 1922 that is threaded to accept a bolt (not shown) that may be the same as the bolt shown in FIGS. 3A and 3B. The opening 1922 is located so that the bolt is aligned with the center of the die 210, 250 when the retainer is installed in place of the plastic bar 322, 362 shown in FIGS. 3A and 3B. The plastic used to form the plate 1912 may be acrylic, although other plastics or other material may be used. The material used and its thickness should be selected so that the plate 1912 will break if the bolt is over-tightened.

Those skilled in the art will understand that the invention may be used to cool electronic components such as graphics processors as well as microprocessors by adding additional fluid heat exchanger modules either in series or in parallel with the fluid heat exchanger used to cool the microprocessor. Similarly, multiprocessor computers can be cooled using multiple fluid heat exchangers.

Other embodiments will be apparent to those skilled in the art and, therefore, the invention is defined in the claims.

What is claimed is:

1. A heat exchanger for extracting heat from a microprocessor whose die has an exposed non-active surface extending above and parallel to a generally planar surface of said microprocessor, comprising:

a body through which a fluid may be circulated;

a protrusion extending from said body, said protrusion having a first surface that is substantially congruent with and conforms to said non-active surface and may be thermally coupled to said non-active surface and a sidewall that extends between the boundary of said first surface and said body; and a heat-conducting path extending from said first surface through said protrusion to a region of said body that is thermally coupled to said fluid when said fluid is circulated through said body.

2. The heat exchanger as defined in claim 1, wherein a passage is provided within said body through which said fluid may be circulated, said passage comprising a series of generally spherical chambers separated by generally cylindrical constrictions, and the transitions between the chambers and the constrictions are smooth.

3. The heat exchanger as defined in claim 2, wherein said sidewall is generally perpendicular to the said first surface at its line of contact therewith and has a radius of curvature of at least six mm and the surface of said body is at least six mm from the plane of said first surface.

4. The heat exchanger as defined in claim 1, wherein:

said body is cuboid, having broad parallel upper and lower faces and four sides;

said protrusion extends downward from said lower face; and said sidewall has a radius of curvature that is approximately equal to the perpendicular distance between the plane of said first surface and said lower face.

5. The heat exchanger as defined in claim 4, wherein a passage is provided within said body through which said fluid may be circulated, said passage comprising a series of chambers separated by constrictions.

6. The heat exchanger as defined in claim 5, wherein the chambers are generally spherical, the constrictions are generally cylindrical, and the transitions between the chambers and the constrictions are smooth.

7. The heat exchanger as defined in claim 6, wherein the perpendicular distance between the plane of said first surface and said lower face is at least six mm.

8. The heat exchanger as defined in claim 7, wherein the heat exchanger is cast in one piece from an aluminum alloy.

9. A heat exchanger for extracting heat from an electronic device through a hot portion of the surface of said electronic device, comprising:

a body through which a fluid may be circulated;

a protrusion extending from said body, said protrusion having a first surface that may be thermally coupled to said hot portion and a sidewall that extends between the boundary of said first surface and said body; and a heat-conducting path extending from said first surface through said protrusion to a region of said body that is thermally coupled to said fluid when said fluid is circulated through said body, wherein when said first surface is thermally coupled to said hot portion, the surface of said body is sufficiently distant from said surface of said electronic device that ambient air may circulate therebetween.

10. The heat exchanger as defined in claim 9, wherein said electronic device is a microprocessor comprising a die mounted in a package and the said hot portion is thermally coupled to said die.

11. The heat exchanger as defined in claim 10, wherein:

said electronic device is a microprocessor comprising a die mounted in a package;

said package has a generally planar upper surface above which a planar non-active surface of said die extends; and said non-active surface is said hot portion.

12. The heat exchanger as defined in claim 11, wherein said first surface is substantially congruent with and conforms to said non-active surface.

13. The heat exchanger as defined in claim 12, wherein a passage is provided within said body through which said fluid may be circulated, said passage comprising a series of chambers separated by constrictions.

14. The heat exchanger as defined in claim 13, wherein said passage follows a path through said body that is topologically equivalent to a spiral, entering said body at a location adjacent to said protrusion and winding in a direction generally away from said protrusion.

15. The heat exchanger as defined in claim 14, wherein said heat exchanger is comprised of:
   a central section having a first face and a second face that are substantially parallel to each other;
   a first side section and a second side section, each said side section having two substantially parallel faces, one face of the first side section mating with said first face of said central section and one face of said second side section mating with said second face of said central section; and
   two end caps for mating with said faces of said side sections not mating with said central section,
   wherein:
      said protrusion extends from said central section,
      each said section contains interior spaces each of which opens to both faces of said section, said side sections having selected ones of said interior spaces connected together within said side sections so that said passage is formed when said sections and said end caps are mated together, and
      said heat exchanger is assembled by joining said mating faces together.

16. The heat exchanger as defined in claim 15, wherein said internal spaces are defined by substantially cylindrical walls that are substantially perpendicular to the faces of said sections.

17. The heat exchanger as defined in claim 13, further comprising a heat pipe extending from within said protrusion into said body, whereby said heat pipe provides a portion of said heat-conducting path.

18. The heat exchanger as defined in claim 17, wherein said protrusion includes a heat-conducting plate, one of the surfaces of said plate thermally coupled to said heat pipe and the other surface of said plate providing said first surface.

19. The heat exchanger as defined in claim 18, said heat pipe comprising a cavity defined by said heat-conducting plate, a cylindrical bore beginning at said heat-conducting plate, passing through said protrusion and said body, and ending in an opening at the end of said bore opposite to said heat-conducting plate, said opening for receiving a plug to seal said cavity.

20. The heat exchanger as defined in claim 19, wherein said passage follows a path through said body that is topologically equivalent to a spiral, entering said body at a location adjacent to said protrusion and winding around said heat pipe and away from said protrusion.

21. The heat exchanger as defined in 20, wherein said heat exchanger is comprised of:
   a central section having a first face and a second face that are substantially parallel to each other;
   a first side section and a second side section, each said side section having two substantially parallel faces, one face of the first side section mating with said first face of said central section and one face of said second side section mating with said second face of said central section; and
   two end caps for mating with said faces of said side sections not mating with said central section,
   wherein:
      said protrusion extends from said central section,
      each said section contains interior spaces each of which opens to both faces of said section, said side sections having selected ones of said interior spaces connected together within said side sections so that said passage is formed when said sections and said end caps are mated together, and
      said heat exchanger is assembled by joining said mating faces together.

22. The heat exchanger as defined in claim 21, wherein said internal spaces are defined by substantially cylindrical walls that are substantially perpendicular to the faces of said sections.

23. The heat exchanger as defined in claim 22, wherein said heat pipe is in said central section.

24. A heat exchanger for extracting heat from an electronic device through a hot portion of the surface of said electronic device, comprising a body through which a fluid may be circulated, said body having:
   a first surface that may be thermally coupled to said hot portion; and
   a heat-conducting path from said first surface to a region of said body that is thermally coupled to said fluid when said fluid is circulated through said body,
   such that, when said first surface is thermally coupled to said hot portion, the surface of said body other than said first surface is sufficiently distant from the surface of said electronic device other than said hot portion that ambient air may circulate therebetween.

25. The heat exchanger as defined in claim 24, wherein said electronic device is a microprocessor comprising a die mounted in a package, said package having a generally planar upper surface above which a planar non-active surface of said die extends, and said non-active surface is said hot portion.

26. The heat exchanger as defined in claim 25, wherein said first surface is substantially congruent with and conforms to said hot portion so that said first surface may be thermally coupled to said hot portion.

27. A heat exchanger for extracting heat from an electronic device through a hot portion of the surface of said electronic device, comprising:
   a body that may be cooled by a circulating fluid, said body having a first surface that may be thermally coupled to said hot portion;
   a conduit for circulating said fluid; and
   a heat-conducting path from said first surface to a portion of said body that is thermally coupled to said fluid when said fluid is circulated,
   such that when said first surface is thermally coupled to said hot portion the surface of said body other than said first surface and the conduit are sufficiently distant from the surface of said electronic device other than said hot portion that ambient air may circulate therebetween.

28. The heat exchanger as defined in claim 27, wherein said conduit for circulating said fluid is substantially outside said body.

29. The heat exchanger as defined in claim 28, wherein said conduit for circulating said fluid comprises a length of tubing wound around said body.

30. The heat exchanger as defined in claim 29, wherein said body has a protrusion and said first surface is located on said protrusion.

31. The heat exchanger as defined in claim 30, wherein said electronic device is a microprocessor comprising a die mounted in a package, said package having a generally planar upper surface above which a parallel planar non-active surface of said die extends, and the said hot portion is said non-active surface of said die.

32. The heat exchanger as defined in claim 31, wherein said first surface is substantially congruent with and conforms to said hot portion so that said first surface may be thermally coupled to said hot portion.

33. An apparatus for cooling an electronic device, comprising:
a first fluid heat exchanger for transferring heat from a hot portion of the surface of said electronic device to a fluid, said first fluid heat exchanger comprising
a body through which said fluid may be circulated,
a protrusion extending from said body, said protrusion having a first surface that may be thermally coupled to said hot portion and a sidewall that extends between the boundary of said first surface and said body, and
a heat-conducting path extending from said first surface through said protrusion to a region of said body that is thermally coupled to said fluid when said fluid is circulated through said body;
a chiller for chilling said fluid; and
a pump for circulating said fluid through said chiller and said first fluid heat exchanger.

34. The apparatus as defined in claim 33, wherein said electronic device is a microprocessor comprising a die mounted in a package, said package having a generally planar upper surface above which a planar non-active surface of said die extends, and the said hot portion is said non-active surface.

35. The apparatus as defined in claim 34, wherein said first surface is substantially congruent with and conforms to said hot portion so that said first surface may be thermally coupled to said hot portion.

36. The apparatus as defined in claim 35, wherein when said first surface is thermally coupled to said hot portion, the surface of said body is sufficiently distant from said upper surface that ambient air may circulate therebetween.

37. The apparatus as defined in claim 35, wherein said sidewall is generally perpendicular to the said first surface and all of the surface of said body is at least six mm from the plane of said first surface.

38. The apparatus as defined in claim 35, wherein a passage is provided within said body through which said fluid may be circulated, said passage comprising a series of chambers separated by constrictions.

39. The apparatus as defined in claim 38, wherein said passage follows a path through said body that is topologically equivalent to a spiral, entering said body at a location adjacent to said protrusion and winding in a direction generally away from said protrusion.

40. The apparatus as defined in claim 39, wherein said first heat exchanger is comprised of:
a central section having a first face and a second face that are substantially parallel to each other;
a first side section and a second side section, each said side section having two substantially parallel faces, one face of the first side section mating with said first face of said central section and one face of said second side section mating with said second face of said central section; and
two end caps for mating with said faces of said side sections not mating with said central section,
wherein:
said protrusion extends from said central section,
each said section contains interior spaces each of which opens to both faces of said section, said side sections having selected ones of said interior spaces connected together within said side sections so that said passage is formed when said sections and said end caps are mated together, and
said first heat exchanger is assembled by joining said mating faces together.

41. The apparatus as defined in claim 38, further comprising a heat pipe extending from within said protrusion into said body, whereby said heat pipe provides a portion of said heat-conducting path.

42. The apparatus as defined in claim 41, wherein said protrusion includes a heat-conducting plate, one of the surfaces of said plate thermally coupled to said heat pipe and the other surface of said plate providing said first surface.

43. The apparatus as defined in claim 42, said heat pipe comprising a cavity defined by said heat-conducting plate, a cylindrical bore beginning at said heat-conducting plate, passing through said protrusion and said body, and ending in an opening at the end of said bore opposite to said heat-conducting plate, said opening for receiving a plug to seal said cavity.

44. The apparatus as defined in claim 43, wherein said passage follows a path through said body that is topologically equivalent to a spiral, entering said body at a location adjacent to said protrusion and winding around said heat pipe and away from said protrusion.

45. The apparatus as defined in claim 44, wherein said first heat exchanger is comprised of:
a central section having a first face and a second face that are substantially parallel to each other;
a first side section and a second side section, each said side section having two substantially parallel faces, one face of the first side section mating with said first face of said central section and one face of said second side section mating with said second face of said central section; and
two end caps for mating with said faces of said side sections not mating with said central section,
wherein:
said protrusion extends from said central section,
each said section contains interior spaces each of which opens to both faces of said section, said side sections having selected ones of said interior spaces connected together within said side sections so that said passage is formed when said sections and said end caps are mated together, and
said first heat exchanger is assembled by joining said mating faces together.

46. The heat exchanger as defined in claim 45, wherein said internal spaces are defined by substantially cylindrical walls that are substantially perpendicular to the faces of said sections.

47. The heat exchanger as defined in claim 46, wherein said heat pipe is in said central section.

48. The heat exchanger as defined in claim 47, wherein said heat pipe contains a mixture consisting essentially of acetone, isopropyl alcohol, and water as a working fluid.

49. The apparatus as defined in claim 33, wherein said chiller comprises:
a second fluid heat exchanger through which said fluid may be circulated;

a heat spreader plate one face of which is thermally coupled to said second heat exchanger; and a stack of spaced-apart heat conductive fins, each of which is thermally coupled to said heat spreader plate and extending from the face of said heat spreader plate opposite to said face of said heat spreader plate that is thermally coupled to said second fluid heat exchanger.

50. The apparatus as defined in claim 49, further comprising a fan oriented to blow air between said fins.

51. The apparatus as defined in claim 50, further comprising a thermoelectric cooler having a cool face and a warm face when connected to a power source, said thermoelectric cooler interposed between said second fluid heat exchanger and said heat spreader plate so that said cool face is thermally coupled to said second fluid heat exchanger and said warm face is thermally coupled to said heat spreader plate.

52. The apparatus as defined in claim 33, wherein said chiller comprises:

a second fluid heat exchanger through which said fluid may be circulated, said second fluid heat exchanger having two substantially parallel extended faces;

two heat spreader plates, each having a first extended face thermally coupled to a discrete extended face of said second fluid heat exchanger and each having a second extended face substantially parallel to its first extended face; and two stacks of spaced-apart heat conductive fins, each stack thermally coupled to said second extended face of a discrete one of said heat spreader plates so that said fins are substantially perpendicular to a plane that is parallel to said heat spreader plates.

53. The apparatus as defined in claim 52, wherein all of said fins are substantially parallel to a each other.

54. The apparatus as defined in claim 53, further comprising a fan oriented to blow air between all of said fins in a direction substantially parallel to said heat spreader plates.

55. The apparatus as defined in claim 54, further comprising a cylindrical housing, wherein said fan, said second fluid heat exchanger, said heat spreader plates, and said fin stacks are mounted inside said housing.

56. The apparatus as defined in claim 55, wherein the lengths of said fins are selected so that each extends to the interior wall of said housing.

57. The apparatus as defined in claim 56, wherein each fin stack includes a base plate and is extruded as a unitary structure.

58. The apparatus as defined in claim 56, wherein each heat spreader plate and associated fin stack is extruded as a unitary structure.

59. The apparatus as defined in claim 52, further comprising two thermoelectric coolers, each having a cool face and a warm face when connected to a power source, each thermoelectric cooler interposed between said second fluid heat exchanger and a discrete one of said heat spreader plates so that said cool face of each said thermoelectric cooler is thermally coupled to said second fluid heat exchanger and said warm face is thermally coupled to one of said heat spreader plates.

60. The apparatus as defined in claim 33, further comprising a tank and wherein said pump is a submersible-type pump and is housed in said tank so that when in operation said pump is submerged in said fluid.

61. The apparatus as defined in claim 60, wherein said pump requires AC power and further comprising a DC to AC inverter for providing AC power to said pump.

* * * * *